United States Patent
Hamada et al.

(10) Patent No.: US 7,474,045 B2
(45) Date of Patent: Jan. 6, 2009

(54) DISPLAY DEVICE HAVING TFT WITH RADIATION-ABSORBING FILM

(75) Inventors: Takashi Hamada, Kanagawa (JP); Masahiko Hayakawa, Kanagawa (JP); Shunpei Yamazaki, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/428,014

(22) Filed: May 2, 2003

(65) Prior Publication Data
US 2004/0004430 A1 Jan. 8, 2004

(30) Foreign Application Priority Data
May 17, 2002 (JP) ............... 2002-143893
Jun. 13, 2002 (JP) ............... 2002-173377

(51) Int. Cl.
*H01J 63/04* (2006.01)
*H01J 1/62* (2006.01)

(52) U.S. Cl. ............... 313/498; 313/503; 313/504; 313/505; 313/506; 428/690; 428/917; 257/40

(58) Field of Classification Search ......... 313/495–497, 313/422, 504, 506, 512, 498, 500; 345/75.2, 345/76, 36, 45; 315/169.3
See application file for complete search history.

(56) References Cited

U.S. PATENT DOCUMENTS

| | | | | |
|---|---|---|---|---|
| 4,143,297 | A * | 3/1979 | Fischer | 313/502 |
| 4,872,043 | A * | 10/1989 | Fujii | 257/245 |
| 5,929,474 | A * | 7/1999 | Huang et al. | 257/292 |
| 5,952,779 | A | 9/1999 | Arai et al. | |
| 6,114,183 | A | 9/2000 | Hamada et al. | |
| 6,114,715 | A * | 9/2000 | Hamada | 257/72 |
| 6,490,014 | B1 | 12/2002 | Ohtani et al. | |
| 6,528,824 | B2 | 3/2003 | Yamagata et al. | |
| 6,538,390 | B2 | 3/2003 | Fujita et al. | |
| 6,624,473 | B1 | 9/2003 | Takehashi et al. | |
| 6,686,274 | B1 * | 2/2004 | Shimazu et al. | 257/E21.165 |

(Continued)

FOREIGN PATENT DOCUMENTS

EP 0 845 925 A2 6/1998

(Continued)

OTHER PUBLICATIONS

Kenji Taniguchi et al. Ed., Chapter 4 "Electrical Properties of Oxide Layers", pp. 167-182, published Jul. 31, 2001 from Realize Co., Ltd. Japan.

(Continued)

*Primary Examiner*—Sikha Roy
*Assistant Examiner*—Natalie K Walford
(74) *Attorney, Agent, or Firm*—Nixon Peabody LLP; Jeffrey L. Costellia

(57) ABSTRACT

A display apparatus including a transistor and a light-emitting device electrically connected to the transistor, where the transistor includes a conductive film. The conductive film may be included in the gate wiring of the transistor or in one of the source and drain wirings of the transistor. The conductive film also includes iron or lead to provide radiation-absorbing. The display apparatus may also include a transistor including an insulating film including iron.

42 Claims, 12 Drawing Sheets

U.S. PATENT DOCUMENTS

| | | | |
|---|---|---|---|
| 6,724,149 B2 * | 4/2004 | Komiya et al. | 315/169.3 |
| 6,744,198 B2 * | 6/2004 | Hirabayashi | 313/506 |
| 6,747,289 B2 | 6/2004 | Yamazaki et al. | |
| 6,758,538 B2 | 7/2004 | Fujita et al. | |
| 6,812,490 B2 | 11/2004 | Takehashi et al. | |
| 6,815,887 B2 * | 11/2004 | Lee et al. | 313/512 |
| 6,828,726 B2 * | 12/2004 | Sakurai et al. | 313/506 |
| 6,924,594 B2 | 8/2005 | Ogura et al. | |
| 6,995,736 B2 | 2/2006 | Eida | |
| 2002/0011783 A1 * | 1/2002 | Hosokawa | 313/504 |
| 2002/0047567 A1 | 4/2002 | Fujita et al. | |
| 2002/0187265 A1 | 12/2002 | Mori et al. | |
| 2003/0168688 A1 | 9/2003 | Ohtani et al. | |
| 2004/0018796 A1 | 1/2004 | Hamada | |
| 2004/0168634 A1 | 9/2004 | Mori et al. | |
| 2005/0218819 A1 | 10/2005 | Eida | |

FOREIGN PATENT DOCUMENTS

| | | |
|---|---|---|
| JP | 57-143864 | 9/1982 |
| JP | 10-158638 | 6/1998 |
| JP | 10-162960 | 6/1998 |
| JP | 10-172767 | 6/1998 |
| JP | 2000-306665 | 11/2000 |
| JP | 2000-349297 | 12/2000 |
| JP | 2001-249627 | 9/2001 |
| JP | 2002-083689 | 3/2002 |
| JP | 2002-083691 | 3/2002 |
| JP | 2002-108250 | 4/2002 |
| JP | 2002-367781 | 12/2002 |
| WO | WO 01/67824 A1 | 9/2001 |
| WO | WO 02/099487 A1 | 12/2002 |

OTHER PUBLICATIONS

Biodex Medical, "Portable Acryl-Lead Bench Shield", http://www.diagnostic-imaging.ca/brs/brs-portable._asp.

S.P. Murada "Silicides for VLSI Applications" Academic Press, Inc. U.S.; pp. 30-32, published Mar. 1983.

S.P. Murarka "Silicides for VLSI Applications" Academic Press, Inc. U.S.; pp. 30-32, published Mar. 1983.

* cited by examiner

DISPLAY DEVICE HAVING TFT WITH RADIATION-ABSORBING FILM

BACKGROUND OF THE INVENTION

1. Field of the Invention

The present invention relates to a display apparatus using a semiconductor device (typically a transistor) as a fundamental component, and in particular to a technical field related to display devices such as an electroluminescence display apparatus, a liquid crystal display apparatus, and a field-emission display apparatus and a technical field related to an electronic equipment in which the display apparatus is installed in an image display part.

2. Description of Related Art

In recent years, developments of liquid crystal display apparatus and electroluminescence display apparatus, in which transistors such as thin film transistors and MOS transistors are integrated on substrates, have been advanced. Each of them is characterized in that transistors are built on a glass substrate by means a thin-film forming technology and these transistors are placed on the respective pixels being arranged in matrix to provide the display apparatus with the function of displaying an image.

Referring to FIG. 11, there is illustrated the configuration of a typical active-matrix electroluminescence display apparatus. In FIG. 11, the reference numeral 1101 denotes a substrate on which thin film transistors 1102 are formed. Each thin film transistor 1102 is connected to a pixel electrode 1103 that acts as an anode of a light-emitting device. In addition, an insulating film 1104 is formed on the pixel electrode 1103. The insulating film 1104 has an opening at a position corresponding to the pixel electrode 1103. Furthermore, a metal film 1106 functioned as a cathode of each of a luminous body 1105 and a light-emitting device is placed over these structural components. Consequently, the electroluminescence display apparatus is configured as described above, so that an image display can be attained with light emission by a current injection to the luminous body 1105.

In this case, such an electroluminescence display apparatus may be fabricated in the usual process up to the formation of the pixel electrode 1103 and the insulating film 1104. In the case of using an organic compound as the luminous body 1105, alternatively, a film-forming method to be used may be a deposition method, an application method, an ink-jet method, or a printing method. Moreover, the formation of the metal film 1106 on these structural components is performed using a deposition method or a spattering method because the heat resistance of the luminous body 1105 is as low as 100° C. or less.

The present inventors found that an abnormal threshold voltage could be observed on the thin film transistor in the electroluminescence display apparatus configured as shown in FIG. 11, which was fabricated in the process of research and development. As a result of investigating the causes of such a phenomenon, the present inventors found that there was a large shift of threshold voltages ($V_G$) before and after the formation of a metal film to be provided as a cathode by means of an electron-beam deposition method. The results are shown in FIGS. 12A and 12B. The data shown in FIGS. 12A and 12B are represented by characteristic curves of the drain voltage and gate voltage characteristics (hereinafter, referred to as $I_D$-$V_G$ characteristics) of the thin film transistors before and after the formation of the metal film to be provided as a cathode. As is evident from FIGS. 12A and 12B, the threshold voltages of the thin film transistors after the formation of the cathode were shifted about 4 volts to the minus side, compared with the threshold voltages before the formation. Moreover, it was also confirmed that the value S (sub-threshold coefficient) indicated an increase (i.e., deterioration) in the steepness of switching characteristics.

It could be considered that the threshold voltage and the value S were substantially changed as a result of causing damage on the thin film transistor at the time of forming the cathode.

The causes of abnormal characteristics of the thin film transistor may include malfunctions of the thin film transistor by damages caused by radiation and a deterioration of the thin film transistor by the generation of electrons or interface state density. The malfunction of the thin film transistor by damages caused by radiation is well known in persons skilled in the art. Generally, the malfunctions may be classified three types: the generation of positive charges caused in the oxide film by irradiation with of a radioactive ray (e.g., gamma ray, neutron, or X ray); the generation of an interface state density of the Si—SiO$_2$ interface; and the generation of neutral electron trap in the oxide film. For malfunctions of transistors caused by radiation damages, the details are described in the publication entitled "Silicon thermal oxide film and Its Interface" (Kenji Taniguchi et al. Ed., pages 167 to 182, published on Jul. 31, 1991 from Realize Co., Ltd., Japan).

Furthermore, in the film formation using an electron beam deposition, it is generally known that radiation (typically X ray) is generated from a metal molten by irradiation with an electron beam. Thus, the present inventors suspected that abnormal characteristics of the thin film transistor (i.e., the threshold voltage thereof was shifted to the minus side) could be observed as a result of the generation of positive charges or the generation of interface state density caused on the gate insulating film or the like of the thin film transistor by the radiation caused at the time of the electron beam deposition.

SUMMARY OF THE INVENTION

The preset invention has been completed in consideration of the above circumstances. Therefore, it is an object of the present invention to provide a technology for forming a metal film without causing any abnormality in the characteristics of a thin film transistor. The gist of the present invention is that it is characterized by preventing the transistor from suffering radiation damage by forming a metal film by an electron-beam deposition method while providing means for shielding the radiation on a substrate on which the transistor is formed.

For attaining the object, a first aspect of the present invention is characterized in that a metal film is formed using an electron-beam deposition method under the conditions in which an insulating film containing an element having radiation-absorbing ability, such as lead or iron (hereinafter, referred to as an insulating film having radiation-absorbing ability) is formed on a transistor. In addition, preferably, the radiation-absorbing film may be covered with an inorganic insulating film.

Also, instead of the radiation-absorbing film, a metal film containing lead or iron may be used as a source electrode and a drain electrode of the transistor or as a black mask (a lightproof film) to protect the transistor from radiation.

A second aspect of the present invention is characterized in that a metal film is formed using an electron-beam deposition method under the conditions in which a channel-forming region is protected by an insulating film containing an element having radiation-absorbing ability such as lead or iron (hereinafter, referred to as an insulating film having radiation-absorbing ability) as a part of an interlayer-insulating film of a transistor.

A third aspect of the present invention is characterized in that a metal film is formed using an electron-beam deposition method under the conditions in which a channel-forming region is protected by a conductive film comprising an element having radiation-absorbing ability such as lead or iron (hereinafter, referred to as a conductive film having radiation-absorbing ability) as a part or the whole of source wiring, drain wiring, or gate wiring of a transistor, or a lightproof film thereof (generally called as a black matrix).

A fourth aspect of the present invention is characterized in that a metal film is formed using an electron-beam deposition method under the conditions in which a channel-forming region is protected by a conductive film consisting of an element having radiation-absorbing ability such as lead or iron (hereinafter, referred to as a conductive film having radiation-absorbing ability) as a part or the whole of source wiring, drain wiring, or gate wiring a transistor, or a lightproof film thereof (generally called as a black matrix).

A radiation-shielding function can be imparted to the insulating film or the conductive film by containing an element having radiation-absorbing ability such as lead or iron in the insulating film or the conductive film. Then, a metal film is formed from above using an electron-beam deposition method under the conditions in which a channel-forming region of a transistor is protected by the insulating film or the conductive film (it means that the insulating film or the conductive film is formed between the channel-forming region and a deposition source). Therefore, it is possible to restrain the arrival of radiation on the transistor (in particular, the channel-forming region and the gate insulating film adjacent to the channel-forming region).

The insulating film or conductive film having a radiation-shielding function can be provided as a part of the configuration of the display apparatus without modification. In the case of the insulating film, furthermore, the electrical resistivity of the insulating film decreases when the insulating film contains a metal element such as lead or iron. However, the insulating properties of the insulation film as an interlayer-insulating film can be sufficiently secured by covering such an insulating film having radiation-absorbing ability with other insulating film or sandwiching between other insulating films.

Furthermore, in the case of using the insulating film having radiation-absorbing ability, the radiation-absorbing ability of the insulating film increases as the content (concentration) of lead or iron in the insulating film increases. In this case, however, an increase in such ability causes a decrease in the electrical resistivity of the insulating film. Therefore, it is preferable to adjust the concentration of lead or iron to be contained in the insulating film such that the electrical resistivity of the insulating film becomes $1.0 \times 10^{12}$ Ωcm or more, preferably $1.0 \times 10^{14}$ Ωcm or more. Furthermore, it is possible to inhibit a decrease in the electrical resistivity of the insulating film by dispersing particles prepared by enveloping lead or iron particles with an insulating material including insulating materials.

Furthermore, instead of the insulating film having radiation-absorbing ability, it is possible to use a thin film having a high tolerance to radiation, such as a silicon carbide film, a gallium nitride film, a diamond film, or a diamond-like carbon film.

In the case of using the conductive film of radiation-absorbing ability, the conductive film comprising an element having radiation-absorbing ability such as lead or iron can be used. Alternatively, the conductive film prepared by adding an element having radiation-absorbing ability into other conductive film (which is one of conductive films except the conductive film containing an element having radiation absorbing ability). In this case, the content of the element may be preferably in the range of 1 to 30 atomic % (typically 1 to 10 atomic %).

BRIEF DESCRIPTION OF DRAWINGS

FIG. 1A is a top view, FIG. 1B is a cross sectional view along the line A-A' in FIG. 1A, and FIG. 1C is an enlarged cross sectional view of the part corresponding to a portion surrounded by the dotted line in FIG. B;

FIG. 4A is a top view, FIG. 4B is a cross sectional view along the line A-A' in FIG. 4A, and FIG. 4C is an enlarged cross sectional view of the part corresponding to a portion surrounded by the dotted line in FIG. 4B;

FIG. 9A is a top view, FIG. 9B is a cross sectional view along the line B-B' in FIG. 9A, FIG. 9C is a cross sectional view along the line A-A' in FIG. 9A;

FIG. 13A is a top view and FIG. 13B is a cross sectional view along the line A-A' in FIG. 13A;

DETAILED DESCRIPTION OF THE PREFERRED EMBODIMENTS

Hereinafter, we will describe preferred embodiments of the present invention.

Embodiment 1

The configuration of a pixel part of a display apparatus as one of preferred embodiments will be described with reference to FIGS. 13A and 13B.

Figure 13A:
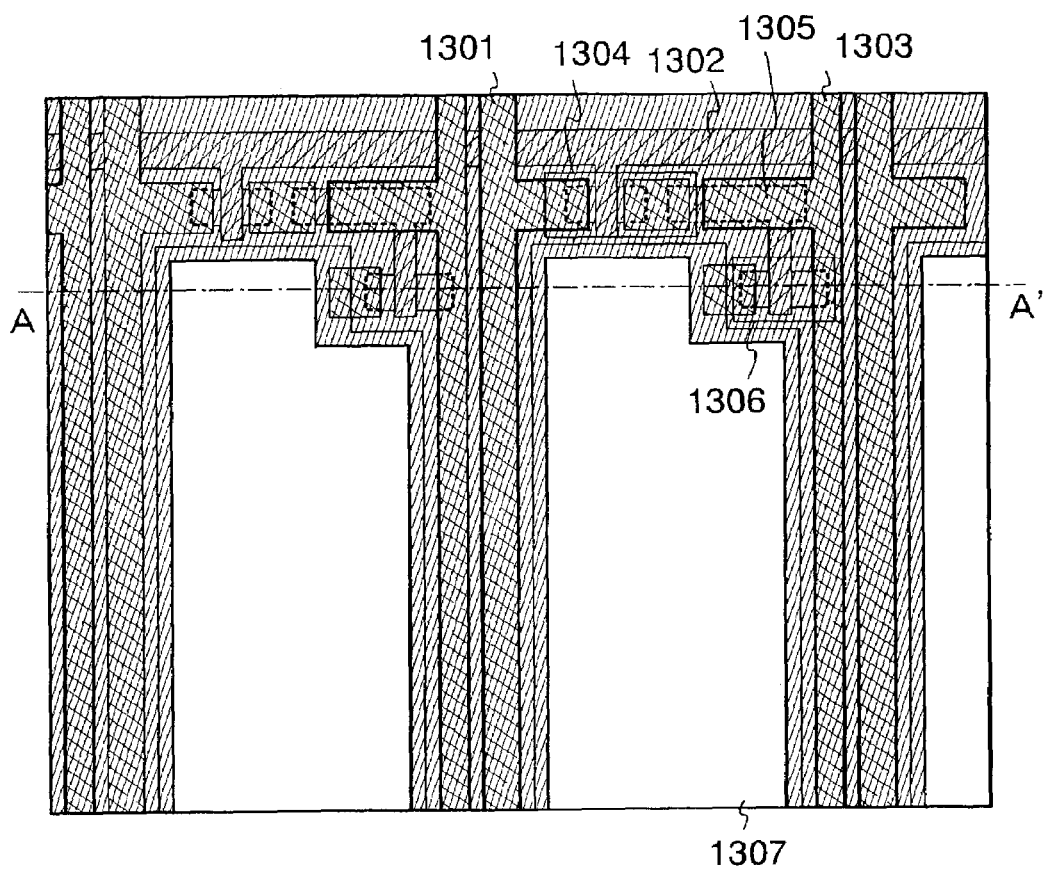
FIGS. 13A and 13B are diagrams showing a pixel configuration of a display apparatus, where
Figure 13B:
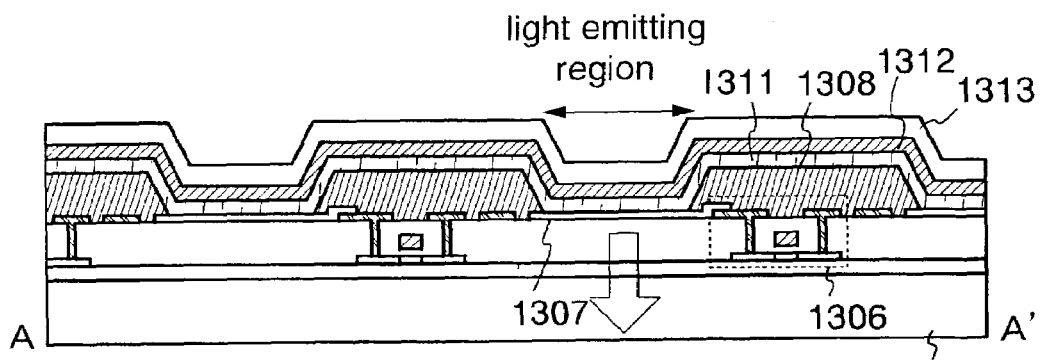

The configuration of the pixel part shown in FIG. 13A is one of those known in the art. The reference numeral 1301 denotes a data signal line, 1302 denotes a gate signal line, 1303 denotes a power source line, 1304 denotes a thin film transistor for switching (hereinafter, referred to as a switching TFT), 1305 denotes a capacitor for retaining an electric charge, 1306 denotes a thin film transistor for driving (hereinafter, referred to as a driving TFT) to be used for supplying current to a light-emitting device, and 1307 denotes a pixel electrode connected to a drain region of the driving TFT. In this case, the pixel electrode 1307 acts as an anode of the light-emitting device. Here, the term "light-emitting device" means a device that comprises a luminous body arranged between a pair of electrodes (anode and cathode) and the term "luminous body" means a layered product prepared by laminating a light-emitting layer, a carrier-injection layer, a carrier-transport layer, a carrier-block layer, and other organic or inorganic compounds required in light emission. In the present embodiment, for instance, an electroluminescent element is provided as the light-emitting device.

The most characteristic feature of the present invention is that a radiation-absorbing film 1308 is placed over the structural components including the end portions of the pixel electrode 1307 except that the most part of the pixel electrode 1307. In this embodiment, the radiation-absorbing film 1308 may be a lead-containing organic resin film. In this film, fine particles of lead may be dispersed, or particles in which lead fine particles are wrapped with insulators may be dispersed.

For more details, the pixel part configured as described above is also illustrated in FIG. 13B, which is a cross sectional view along the line A-A' in FIG. 13A. In FIG. 13B, the reference numeral 1310 denotes a substrate which may be a transparent substrate such as a glass substrate, a quartz substrate, or a plastic substrate. On the substrate 1310, the driving TFT 1306 is formed using a well-known semiconductor process. In addition, the radiation-absorbing film 1308 in a grid pattern is placed over the end portions of the pixel electrode 1307 formed to be connected to the driving TFT 1306, and at least the driving TFT and the switching TFT.

A luminous body 1311, a metal film acting as a cathode 1312, and a passivation film 1313 are formed on the pixel electrode 1307 and the radiation-absorbing film 1308, respectively. The luminous body 1311 is provided as a layered product comprised of a carrier-injection layer, a carrier-transport layer, a carrier-inhibition layer, a light-emitting layer, and other organic or inorganic compounds contributing to the recombination of carrier. The constitution of the luminous body 1311 may be one well known in the art. In addition, the metal film 1312 maybe an aluminum film containing an element belonging to Groups 1 or 2 of the periodic table, a silver thin film, or the like. The passivation film 1313 may be selected from a silicon nitride film aluminum nitride film, a diamond-like carbon film, and other insulating films having high blocking abilities to water and oxygen.

In the display apparatus having the above pixel part of the present embodiment, radiation such as gamma ray, electron beam, or X ray is shielded by the radiation-absorbing film 1308 and cannot reach to the thin film transistor (in particular, an oxide silicon film to be provided as a gate-insulating film) at the time of forming the metal film 1312 to be provided as a cathode even though an electron-beam deposition method is used. Therefore, malfunctions to be caused by the so-called radiation errors such as the generation of positive charge or an increase in interface state density can be avoided.

As described above, according to the configuration of the pixel part shown in the present embodiment, it becomes possible to allow the film formation without any influence of radiation and to prevent the generation of trouble such as abnormal threshold voltage or abnormal value S with radiation when the metal film is formed using an electron-beam deposition method.

Embodiment 2

Figure 14:
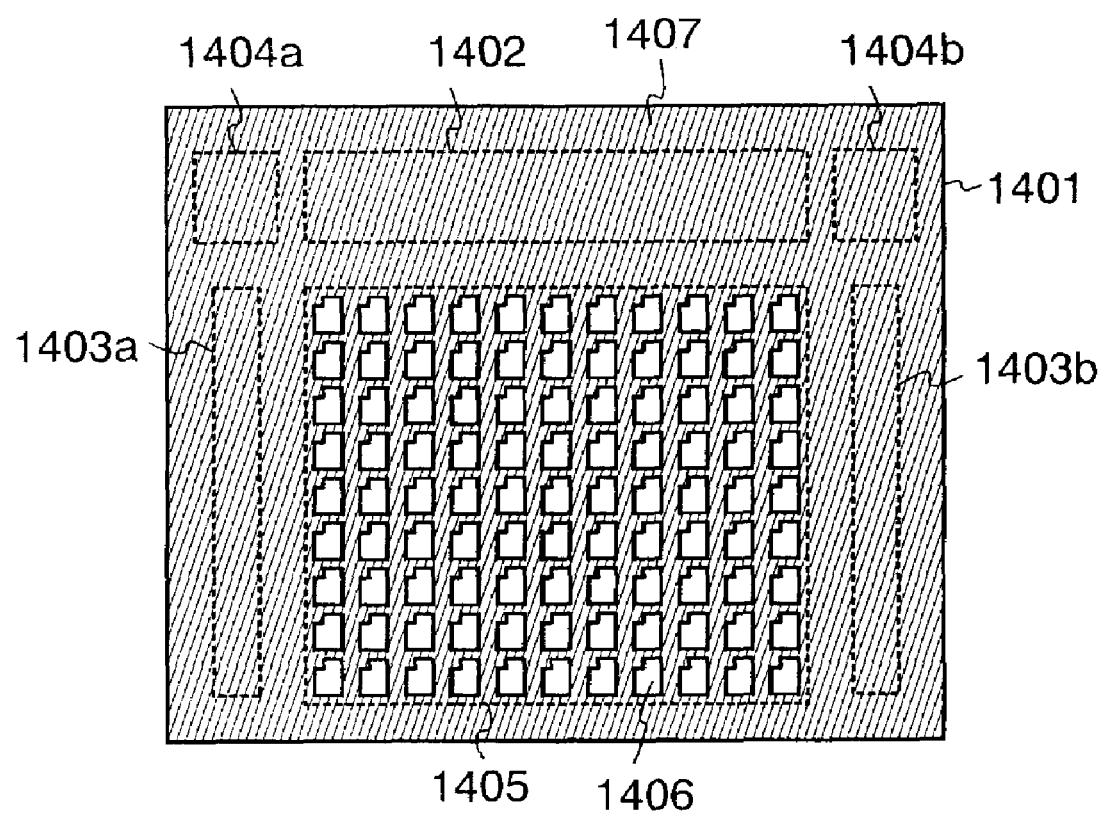
FIG. 14 is a top view illustrating the configuration of the display apparatus.

In this embodiment, a drive circuit that controls video signals and gate signals to be transmitted to a signal line of a pixel part is mounted on a substrate together with the pixel part. FIG. 14 is a top view of an electroluminescence display apparatus integrally formed with a drive circuit, in which a radiation-absorbing film is formed over structural components except pixel electrodes.

In FIG. 14, a substrate 1401 is provided with a data signal line drive circuit 1402, gate signal line drive circuits 1403a and 1403b, signal processing circuits (a corrective circuit, a memory circuit, an arithmetic circuit, and other circuits for processing signals) 1404a and 1404b, and a pixel part 1405 comprised of a plurality of pixels. In each of the pixels, there is provided a pixel electrode 1406.

In this embodiment, a radiation-absorbing film 1407 is placed over all of the structural components including the ends of each pixel electrode 1406 except the main part of each pixel electrode 1406. Therefore, transistors that constitute the data signal line drive circuit 1407, the gate signal line drive circuits 1403a, 1403b, and the signal processing circuits 1404a, 1404b can be prevented from radiation. As a result, it becomes possible to inhibit the generation of troubles with radiation, such as an abnormal threshold voltage and an abnormal value S of the transistor, so that the stabilities of drive circuit and signal processing circuit can be secured.

Embodiment 3

Figure 15:
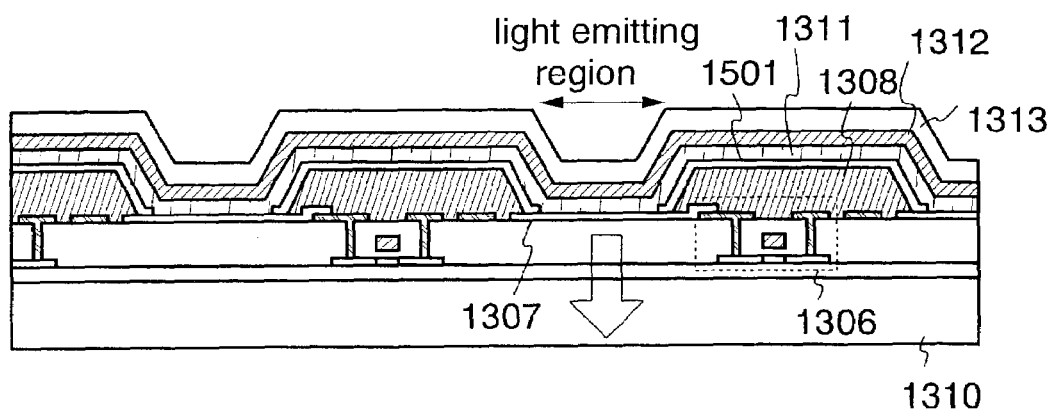
FIG. 15 is a cross sectional view illustrating the pixel configuration of the display apparatus.

In this embodiment, with reference to FIG. 15, there is described an example in which the surface of a radiation-absorbing film is covered with an insulating film. FIG. 15 is a cross sectional view corresponding to FIG. 13B. FIG. 15 shows the same configuration as that of FIG. 13B except that a radiation-absorbing film 1308 is covered with an insulating film 1501. In FIG. 15, therefore, the same structural components as those of FIG. 13B are represented by the same reference numerals as those of FIG. 13B, respectively.

The insulating film 1501 may be one selected from a silicon nitride film, a silicon oxide film, an oxidic silicon nitride film, and other insulating films. Among them, however, it is preferable that the insulating film may be one having good adhesion properties to the radiation-absorbing film 1308. In addition, as a portion corresponding to a pixel electrode 1307 should be removed by etching in the subsequent step, the insulating film 1501 should be one that ensures a desired selection ratio to the pixel electrode 1307. Furthermore, the pixel electrode 1307 may be an oxide conductive film (typically an ITO film) or a metal film (a typically a titanium film or a titanium nitride film). A combination between one of these materials and an insulating film having a large selection ratio thereto may be experimentally defined.

From the configuration described above, the transistor can be prevented from becoming malfunction when the metal film is formed by an electron-beam deposition method. The configuration of the present embodiment may be combined with Embodiment 1 or Embodiment 2.

Embodiment 4

Figure 16:
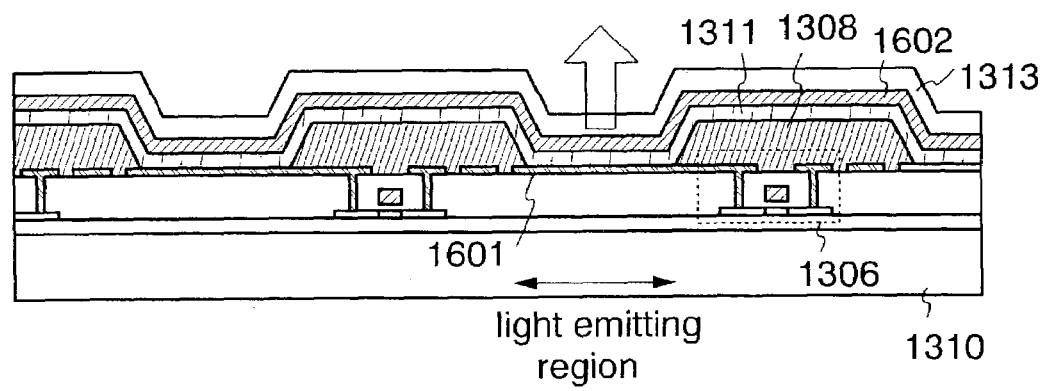
FIG. 16 is a cross sectional view illustrating the pixel configuration of the display apparatus.

In this embodiment, with reference to FIG. 16, there is described an example in which a pixel electrode to be functioned as an anode is formed by a metal film. FIG. 16 is a cross sectional view corresponding to FIG. 13B. FIG. 15 shows the same configuration as that of FIG. 13B except that materials of a pixel electrode 1601 and a cathode 1602 are changed. In FIG. 16, therefore, the same structural components as those of FIG. 13B are represented by the same reference numerals as those of FIG. 13B, respectively.

The pixel electrode 1601 may be one selected from metal films such as a titanium film, a titanium nitride film, a platinum film, and a gold thin film, and layered films of oxide conductive film and metal film in which a layered structure is formed such that an oxide conductive film is located on the top. In these cases, the cathode 1602 should be transparent because of light emission upward in the figure. Therefore, the cathode 1602 may be a metal film having transparency as a whole prepared by forming an aluminum film containing an element belonging to Group 1 or 2 of the periodic table or a silver thin film of about 20 to 70 nm on the side contacting with the luminous body 1311 and laminating an oxide conductive film thereon.

In addition, when the pixel electrode 1601 is used as a cathode, it may be a metal film in which an aluminum film containing an element belonging to Group 1 or 2 of the periodic table or a silver thin film is provided as an outermost layer. In this case, also, the cathode 1602 should be transparent because of light emission upward in the figure. An oxide conductive film may be used as the cathode 1602.

From the configuration described above, the transistor can be prevented from becoming malfunction when the metal film is formed by an electron-beam deposition method. The configuration of the present embodiment may be combined with one of Embodiments 1 to 3.

Embodiment 5

Figure 1A:
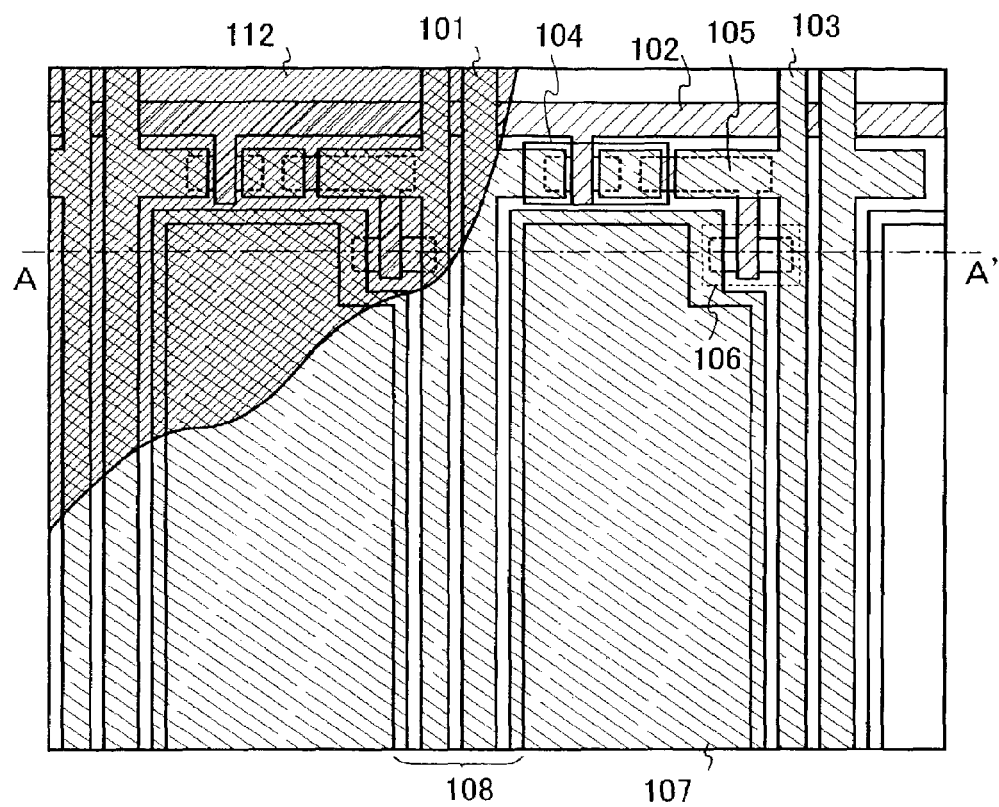
FIGS. 1A to 1C are diagrams showing a pixel configuration of a display apparatus in accordance with the present invention, where

The configuration of a pixel part of a display apparatus as one of preferred embodiments will be described with reference to FIG. 1. At first, as shown in FIG. 1A that illustrates a top view of the pixel part, the reference numeral 101 denotes a data signal line, 102 denotes a gate signal line, 103 denotes a power source line, 104 denotes a thin film transistor for switching (hereinafter, referred to as a switching TFT), 105 denotes a capacitor for retaining electric charges, 106 denotes a drive thin film transistor (hereinafter referred to as a driving TFT) for supplying current to a light-emitting device, and 107 denotes a pixel electrode connected to a drain region of the driving TFT. The pixel electrode 107 functions as an anode. In addition, the reference numeral 112 denotes a counter electrode. The counter electrode 112 functions as a cathode of the light-emitting device. Here, the term "light-emitting device" means a device that comprises a luminous body arranged between a pair of electrodes (anode and cathode) and the term "luminous body" means a layered product prepared by laminating a light-emitting layer, a carrier-injection layer, a carrier-transport layer, a carrier-block layer, and other organic or inorganic compounds required in light emission. In the present embodiment, for instance, an electroluminescent element is provided as the light-emitting device.

Figure 1B:
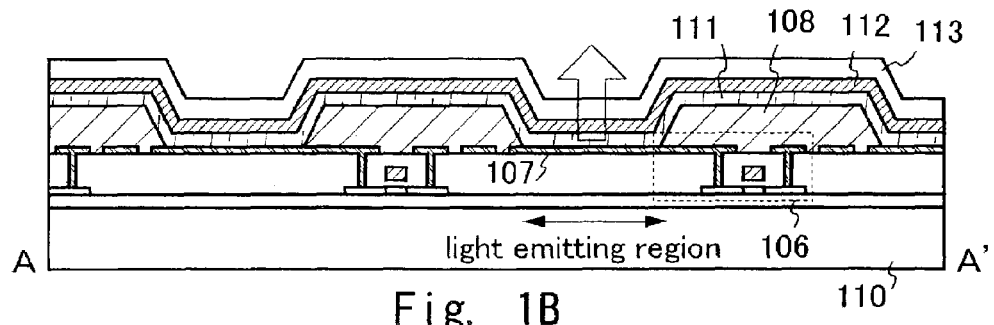

For more details, the pixel part configured as described above is also illustrated in FIG. 1B, which is across sectional view along the line A-A' in FIG. 1A. In FIG. 1B, the reference numeral 110 denotes a substrate which may be a transparent substrate such as a glass substrate, a quartz substrate, or a plastic substrate. On the substrate 110, the driving TFT 106 is formed using a semiconductor process. In addition, the insulating film 108 in a grid pattern is placed over the end portions of the pixel electrode 107 formed to be connected to the driving TFT 106, and at least the driving TFT and the switching TFT.

A luminous body 111, a counter electrode 112 acting as a cathode, and a passivation film 113 are formed on the pixel electrode 107 and the radiation-absorbing film 108. The luminous body 111 is provided as a layered product comprised of a carrier-injection layer, a carrier-transport layer, a carrier-inhibition layer, a light-emitting layer, and other organic or inorganic compounds contributing to the recombination of carrier. The constitution of the luminous body 111 may be one well known in the art. In addition, the counter electrode 112 may be an aluminum film containing an element belonging to Groups 1 or 2 of the periodic table, a silver thin film, or the like. In this embodiment, however, there is a need of being transparent to light emitted from the luminous body 111, so that the counter electrode 112 may be 50 nm or less in film thickness. Furthermore, the passivation film 113 may be selected from a silicon nitride film aluminum nitride film, a diamond-like carbon film, and other insulating films having high blocking abilities to water and oxygen.

Figure 1C:
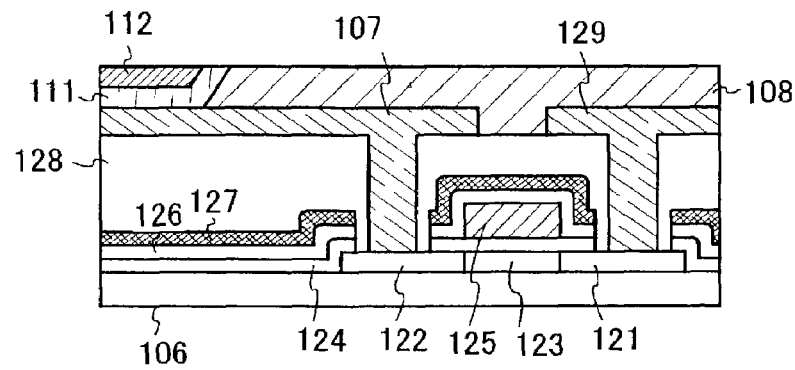

Referring now to FIG. 1C, there is illustrated an elongated cross sectional view of a part of the pixel part, corresponding to the driving TFT. In FIG. 1C, the reference numeral 121 denotes a source region, 122 denotes a drain region, 123 denotes a channel forming region, and these semiconductor regions constitute an active layer. Additionally, another semiconductor region such as a LDD region may be formed if required. Furthermore, the reference numeral 124 denotes a gate insulating film, 125 denotes a gate electrode, and 126 denotes a silicon compound film.

The most characteristic feature of the present embodiment is that an insulating film having radiation-absorbing ability is formed on the silicon compound film 126. In this embodiment, a silicon compound film containing 1 to 10 atomic % of lead as the insulating film 127. It is preferable that the insulating film 127 is thicker as possible as the radiation-absorbing ability increases. However, an allowable thickness of the insulating film 127 may correspond to at least the wavelength of radiation or more.

Furthermore, an organic resin film 128 is formed as a flattening film on the insulating film 127 having radiation-absorbing ability. In other words, an interlayer-insulating film is constructed of the insulating film 127 and the organic resin film 128, so that the insulating film having radiation-absorbing ability is included as a part of the interlayer-insulating film. In addition, the interlayer-insulating film may be a layered structure comprised of two or more layers and the insulating film having radiation-absorbing ability may be used as any one of these layers. Furthermore, as the insulting film having radiation-absorbing ability contains a metal such as lead or iron in the film, it is more effective that the insulating film having radiation-absorbing ability may be used as being sandwiched between silicon compound films (particularly, silicon compound films containing nitrogen is more preferable) for suppressing the dispersion in minimum.

For the organic resin film 128, a photosensitive resin film may be preferably used because of preventing the film from being damaged with plasma. Furthermore, the organic resin film 128 could generate gas by means of heating or variation with time. Therefore, it is effective to prevent the light-emitting device from being subjected to an influence of degasification compound by forming a silicon compound film such as a silicon nitride film having a high barrier property on an organic resin film.

Furthermore, source wiring 129 and a pixel electrode (also serves as drain wiring) 107 are formed on the organic resin film 128. The source wiring 129 is constructed of an aluminum film (not only limited to pure aluminum, and it may be alternatively an aluminum film containing an aluminum alloy or being added with other element) or a layered structure of an aluminum film and other metal film.

For forming the above organic resin film 128, it is preferable to form a first opening in advance. That is, the first opening is formed in the insulating film 124, the silicon compound film 126, and the insulating film 127 having radiation-absorbing ability such that the first opening passes through these films, and the organic resin film 128 is then provided. Subsequently, a second opening having a diameter smaller than that of the first opening is formed in the organic resin film 128, so that the source wiring 129 and the pixel electrode 107 can be brought into connect to the source region 121 and the drain region 122, respectively. Consequently, the source wiring 129 and the pixel electrode 107 can be prevented from being contact with the insulating film 127 having radiation-absorbing ability. In other words, it becomes possible to inhibit leak current through the insulating film having radiation-absorbing ability.

A display apparatus having the configuration of the pixel part of the present embodiment has the following advantages. That is, even though an electron-beam deposition method is used in the formation of a counter electrode 112 to be provided as a cathode, radiation such as gamma ray, electron ray, or X ray can be shielded by an insulating film 127 having radiation-absorbing ability. Therefore, the radiation cannot directly reach to a channel-forming region and a gate insulating film adjacent to the channel-forming region, so that it becomes possible to avoid a malfunction to be caused by the so-called radiation errors such as the generation of positive charges or an increase in interface state density.

As described above, according to the configuration of the pixel part shown in the present embodiment, it becomes possible to allow the film formation without any influence of radiation and to prevent the generation of trouble such as abnormal threshold voltage or abnormal value S with radiation when the metal film is formed using an electron-beam deposition method.

Embodiment 6

In this embodiment, an example in which a conductive film having radiation-absorbing ability is used as a part or the whole of the source wiring and the drain wiring (serves as pixel electrode). Principally, the configuration of the entire display apparatus and the configuration of the light-emitting device are similar to those of Embodiment 5, so that the present embodiment will be described with reference to FIG. 2, which is corresponding to FIG. 1C.

Figure 2:
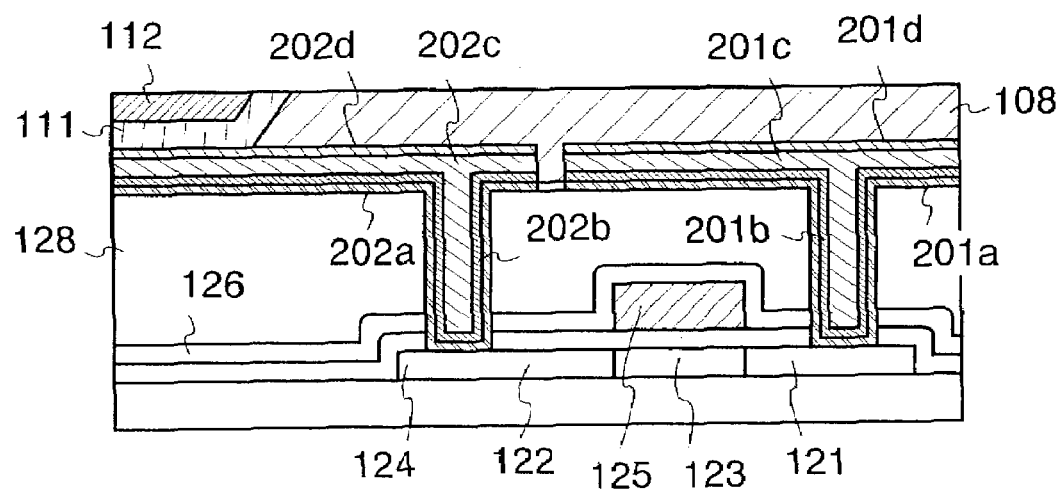
FIG. 2 is a cross sectional view illustrating the configuration of the display apparatus.

In FIG. 2, the description of structural components provided with the same reference numerals as those of FIG. 1C may be referred to those of Embodiment 5. The characteristic feature of the present embodiment is that a source wiring 201 is constructed of a first conductive film 201a, a second conductive film 201b, a third conductive film 201c, and a fourth conductive film 201d, and also a conductive film having radiation-absorbing ability is used as a second conductive film 201b. Likewise, a pixel electrode 202 is constructed of a first conductive film 202a, a second conductive film 202b, a third conductive film 202c, and a fourth conductive film 202d, and also a conductive film having radiation-absorbing ability is used as the second conductive film 202b. Furthermore, source wiring 201 is formed such that it covers the upper side of the channel-forming region 123.

In this embodiment, a titanium film is used as each of first conductive films 201a and 202a for making a good ohmic contact between the source region 121 and the drain region 122. In addition, a lead or iron thin film is used as each of the second films 201b and 202b. Furthermore, an aluminum film is used as each of the third conductive films 201c and 202c for decreasing the wiring resistance. Furthermore, a titanium nitride film is used as each of the fourth conductive films 201d and 202d for allowing such a film to be functioned as an anode of the light-emitting device using a material having a large work function. Of course, as far as the conductive film having radiation absorbing ability is used as the second conductive films 201b and 202b. Other conductive films are not limited to these films.

A display apparatus having the configuration of the pixel part of the present embodiment has the following advantages. That is, even though an electron-beam deposition method is used in the formation of a counter electrode 112 to be provided as a cathode, radiation such as gamma ray, electron ray, or X ray can be shielded by a conductive film 201b having radiation-absorbing ability. Therefore, the radiation cannot directly reach to a channel-forming region and a gate insulating film adjacent to the channel-forming region, so that it becomes possible to avoid a malfunction to be caused by the so-called radiation errors such as the generation of positive charges or an increase in interface state density.

As described above, according to the configuration of the pixel part shown in the present embodiment, it becomes possible to allow the film formation without any influence of radiation and to prevent the generation of trouble such as abnormal threshold voltage or abnormal value S with radiation when the metal film is formed using an electron-beam deposition method.

In the present embodiment, furthermore, the radiation-shielding effect can be further increased by providing the insulating film having radiation-absorbing ability shown in Embodiment 5 as a part of the interlayer insulating film and combining such a film with the configuration of the present embodiment.

Embodiment 7

In this embodiment, an example in which a conductive film having radiation-absorbing ability is used as a part or the whole of the source wiring and the drain wiring (serves as pixel electrode). Principally, the configuration of the entire display apparatus and the configuration of the light-emitting device are similar to those of Embodiment 5, so that the present embodiment will be described with reference to FIG. 3, which is corresponding to FIG. 1C.

Figure 3:
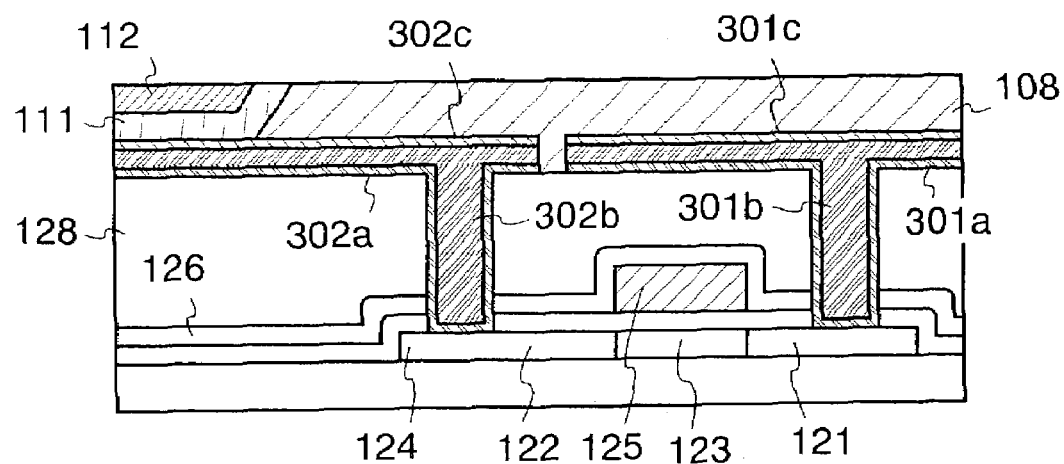
FIG. 3 is a cross sectional view illustrating the configuration of the display apparatus.

In FIG. 3, the description of structural components provided with the same reference numerals as those of FIG. 1C may be referred to those of Embodiment 5. The characteristic feature of the present embodiment is that a source wiring 301 is constructed of a first conductive film 301a, a second conductive film 301b, and a third conductive film 301c, and also a conductive film having radiation-absorbing ability is used as a second conductive film 301b. Likewise, a pixel electrode 302 is constructed of a first conductive film 302a, a second conductive film 302b, and a third conductive film 302c, and also a conductive film having radiation-absorbing ability. Furthermore, source wiring 301 is formed such that it covers the upper side of the channel-forming region 123.

In this embodiment, a titanium film is used as each of first conductive films 301a and 302a for making a good ohmic contact between the source region 121 and the drain region 122. In addition, an aluminum film containing lead or iron is used as each of the second films 301b and 302b for decreasing the wiring resistance while having radiation shielding function. Furthermore, a titanium nitride film is used as each of the third conductive films 301c and 302c for allowing such a film to be functioned as an anode of the light-emitting device. Of course, as far as the conductive film having radiation absorbing ability is used as the second conductive films 301b and 302b. Other conductive films are not limited to these films.

A display apparatus having the configuration of the pixel part of the present embodiment has the following advantages. That is, even though an electron-beam deposition method is used in the formation of a counter electrode 112 to be provided as a cathode, radiation such as gamma ray, electron ray, or X ray can be shielded by a conductive film 301b having radiation-absorbing ability. Therefore, the radiation cannot directly reach to a channel-forming region and a gate insulating film adjacent to the channel-forming region, so that it becomes possible to avoid a malfunction to be caused by the so-called radiation errors such as the generation of positive charges or an increase in interface state density.

As described above, according to the configuration of the pixel part shown in the present embodiment, it becomes possible to allow the film formation without any influence of radiation and to prevent the generation of trouble such as abnormal threshold voltage or abnormal value S with radiation when the metal film is formed using an electron-beam deposition method.

In the present embodiment, furthermore, the radiation-shielding effect can be further increased by providing the insulating film having radiation-absorbing ability shown in Embodiment 5 as a part of the interlayer insulating film and combining such a film with the configuration of the present embodiment.

Embodiment 8

Figure 4A:
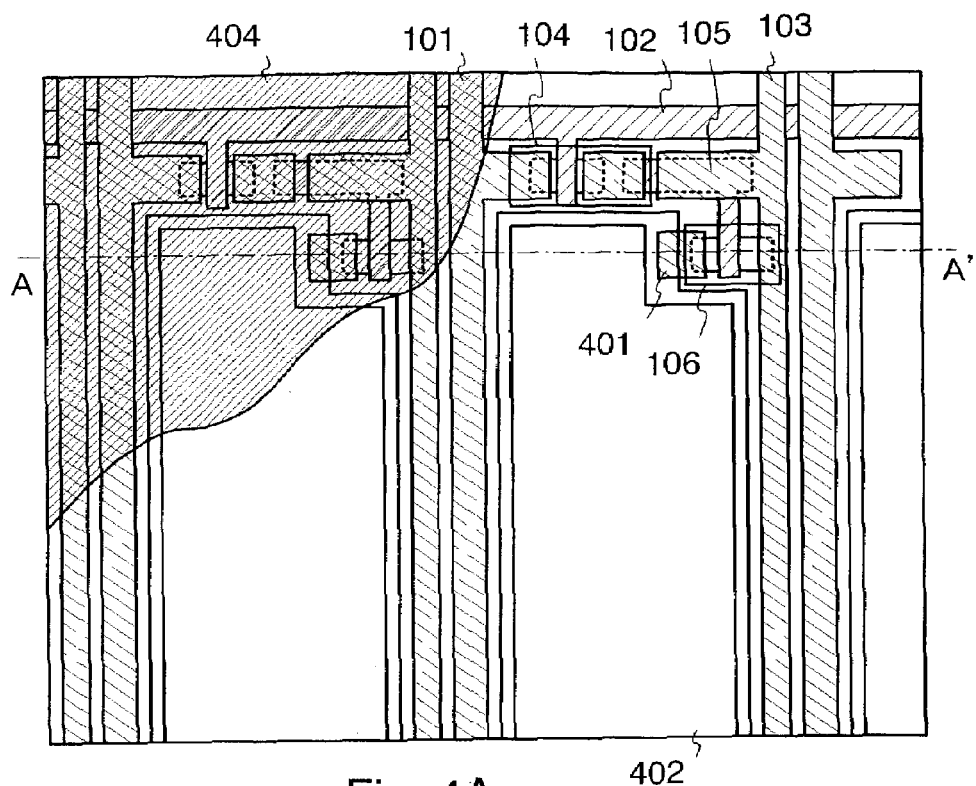
FIGS. 4A to 4C are diagrams showing a pixel configuration of a display apparatus in accordance with the present invention, where
Figure 4B:
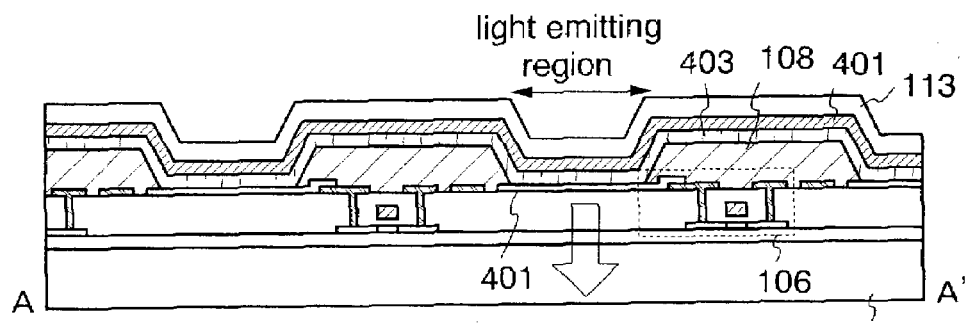
Figure 4C:
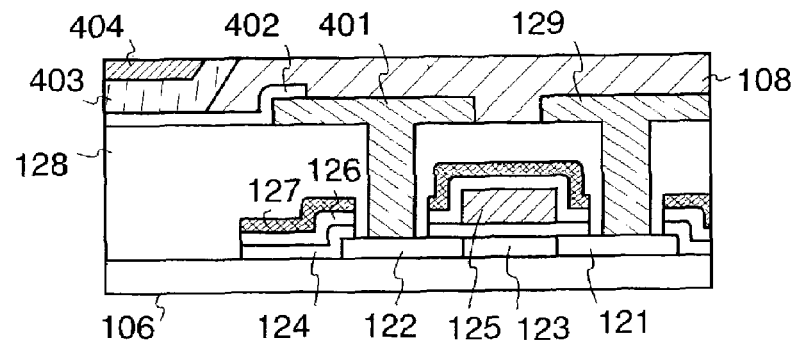

In the present embodiment, the configuration of a pixel electrode is different from Embodiment 5 and an example thereof is shown in FIGS. 4A to 4C. Principally, the configuration of the entire display apparatus and the configuration of the light-emitting device are similar to those of Embodiment 5, so that the description of portions denoted by the same reference numerals corresponding to FIGS. 1A to 1C may be referred to Embodiment 5.

The characteristic feature of the present embodiment is that a pixel electrode 402 electrically connected to drain wiring 401 is formed and is formed of an oxide conductive film. Of course, the pixel electrode 402 formed of the oxide conductive film functions as an anode of the light-emitting device. Therefore, the configuration of a luminous body 403 is different from Embodiment 5. However, just as Embodiment 5, the conventional configuration of the luminous body may be used. In addition, a counter electrode 404 may be prepared using the same material as that of the counter electrode 112 described in Embodiment 5. In this embodiment, however, there is no need to make the counter electrode 404 as a thick film because light emitted from the luminous body 403 travels toward the substrate 110. Furthermore, as a matter of course, the substrate 110 must be made of a material that transmits visual light.

It is preferable to remove the insulating film 127 having radiation-absorbing ability from a light-emitting region. As the insulating film contains an element having radiation-absorbing ability, the transmittance of the insulating film decreases. However, it is also possible to leave the insulating film 127 in case a sufficient transmittance of the insulating film is secured by lowering the concentration of the element having radiation-absorbing ability in the insulating film.

A display apparatus having the configuration of the pixel part of the present embodiment has the following advantages. That is, even though an electron-beam deposition method is used in the formation of a counter electrode 404 to be provided as a cathode, radiation such as gamma ray, electron ray, or X ray can be shielded by an insulating film 127 having radiation-absorbing ability. Therefore, the radiation cannot directly reach to a channel-forming region and a gate insulating film adjacent to the channel-forming region, so that it becomes possible to avoid a malfunction to be caused by the so-called radiation errors such as the generation of positive charges or an increase in interface state density.

As described above, according to the configuration of the pixel part shown in the present embodiment, it becomes possible to allow the film formation without any influence of radiation and to prevent the generation of trouble such as abnormal threshold voltage or abnormal value S with radiation when the metal film is formed using an electron-beam deposition method.

Embodiment 9

In this embodiment, an example in which a conductive film having radiation-absorbing ability is used as a part or the whole of the source wiring and the drain wiring (serves as pixel electrode). Principally, the configuration of the entire display apparatus and the configuration of the light-emitting device are similar to those of Embodiment 5 except that the configuration of a pixel electrode is similar to Embodiment 8.

Figure 5:
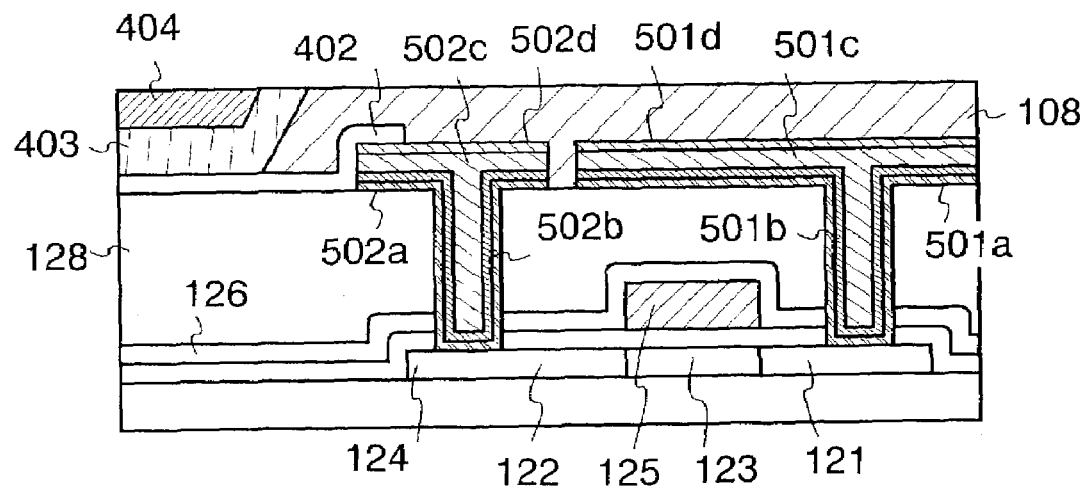
FIG. 5 is a cross sectional view illustrating the configuration of the display apparatus.

In FIG. 5, the description of structural components provided with the same reference numerals as those of FIG. 1C or FIG. 4C may be referred to those of Embodiment 5 or Embodiment 8. The characteristic feature of the present embodiment is that a source wiring 501 is constructed of a first conductive film 501a, a second conductive film 501b, a third conductive film 501c, and a fourth conductive film 501d, and also a conductive film having radiation-absorbing ability is used as a second conductive film 501b. Likewise, a pixel electrode 502 is constructed of a first conductive film 502a, a second conductive film 502b, a third conductive film 502c, and a fourth conductive film 502d, and also a conductive film having radiation-absorbing ability is used as the second conductive film 502b. Furthermore, source wiring 501 is formed such that it covers the upper side of the channel-forming region 123.

In this embodiment, a titanium film is used as each of first conductive films 501a and 502b for making a good ohmic contact between the source region 121 and the drain region 122. In addition, a lead or iron thin film is used as each of the second films 501b and 502b. Furthermore, an aluminum film is used as each of the third conductive films 501c and 502c for decreasing the wiring resistance. Furthermore, a titanium nitride film is used as each of the fourth conductive films 501d and 502d for allowing such a film to be functioned as an anode of the light-emitting device using a material having a large work function. Of course, as far as the conductive film having radiation absorbing ability is used as the second conductive films 501b and 502b, other conductive films are not limited to these films.

A display apparatus having the configuration of the pixel part of the present embodiment has the following advantages. That is, even though an electron-beam deposition method is used in the formation of a counter electrode 404 to be provided as a cathode, radiation such as gamma ray, electron ray, or X ray can be shielded by a conductive film 501b having radiation-absorbing ability. Therefore, the radiation cannot directly reach to a channel-forming region and a gate insulating film adjacent to the channel-forming region, so that it becomes possible to avoid a malfunction to be caused by the so-called radiation errors such as the generation of positive charges or an increase in interface state density.

As described above, according to the configuration of the pixel part shown in the present embodiment, it becomes possible to allow the film formation without any influence of radiation and to prevent the generation of trouble such as abnormal threshold voltage or abnormal value S with radiation when the metal film is formed using an electron-beam deposition method.

In the present embodiment, furthermore, the radiation-shielding effect can be further increased by providing the insulating film having radiation-absorbing ability shown in Embodiment 8 as a part of the interlayer insulating film and combining such a film with the configuration of the present embodiment.

Embodiment 10

In this embodiment, an example in which a conductive film containing an element having radiation-absorbing ability is used as a part or the whole of the source wiring and the drain wiring (serves as pixel electrode). Principally, the configuration of the entire display apparatus and the configuration of the light-emitting device are similar to those of Embodiment 5 except that the configuration of a pixel electrode is similar to Embodiment 8.

Figure 6:
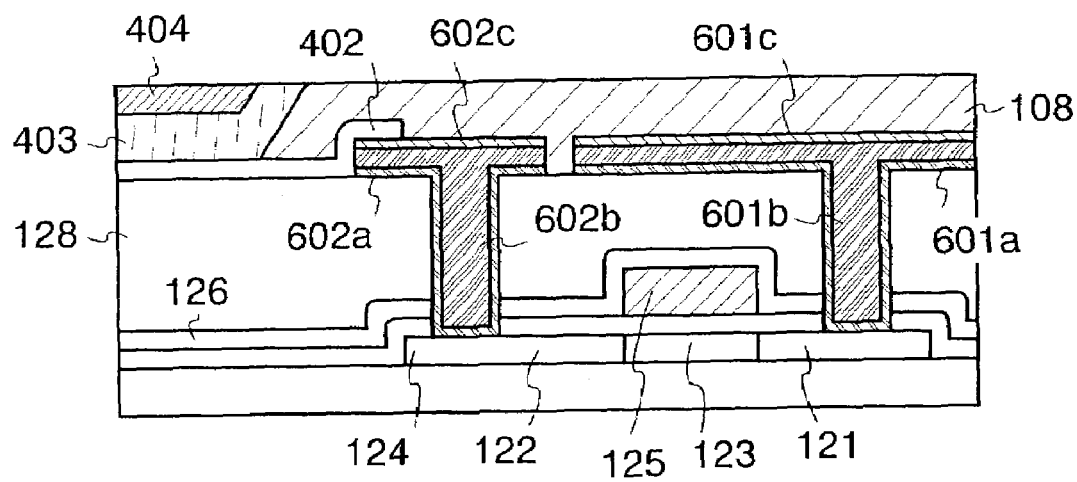
FIG. 6 is a cross sectional view illustrating the configuration of the display apparatus.

In FIG. 6, the description of structural components provided with the same reference numerals as those of FIG. 1C or FIG. 4C may be referred to those of Embodiment 5 or Embodiment 8. The characteristic feature of the present embodiment is that a source wiring 601 is constructed of a first conductive film 601a, a second conductive film 601b, and a third conductive film 601c, and also a conductive film having radiation-absorbing ability is used as a second conductive film 601b. Likewise, a pixel electrode 602 is constructed of a first conductive film 602a, a second conductive film 602b, and a third conductive film 602c, and also a conductive film having radiation-absorbing ability is used as the second conductive film 602b. Furthermore, source wiring 601 is formed such that it covers the upper side of the channel-forming region 123.

In this embodiment, a titanium film is used as each of first conductive films 601a and 602a for making a good ohmic contact between the source region 121 and the drain region 122. In addition, an aluminum film containing lead or iron is used as each of the second conductive films 601b and 602b for decreasing the wiring resistance while having the radiation shielding function. Furthermore, a titanium nitride film is used as each of the third conductive films 601c and 602c for allowing such a film to be functioned as an anode of the light-emitting device. Of course, as far as the conductive film having radiation absorbing ability is used as the second conductive films 601b and 602b, other conductive films are not limited to these films.

A display apparatus having the configuration of the pixel part of the present embodiment has the following advantages. That is, even though an electron-beam deposition method is used in the formation of a counter electrode 404 to be provided as a cathode, radiation such as gamma ray, electron ray, or X ray can be shielded by a conductive film 601b having radiation-absorbing ability. Therefore, the radiation cannot directly reach to a channel-forming region and a gate insulating film adjacent to the channel-forming region, so that it becomes possible to avoid a malfunction to be caused by the so-called radiation errors such as the generation of positive charges or an increase in interface state density.

As described above, according to the configuration of the pixel part shown in the present embodiment, it becomes possible to allow the film formation without any influence of radiation and to prevent the generation of trouble such as abnormal threshold voltage or abnormal value S with radiation when the metal film is formed using an electron-beam deposition method.

In the present embodiment, furthermore, the radiation-shielding effect can be further increased by providing the insulating film having radiation-absorbing ability shown in Embodiment 8 as a part of the interlayer insulating film and combining such a film with the configuration of the present embodiment.

Embodiment 11

Figure 7A:
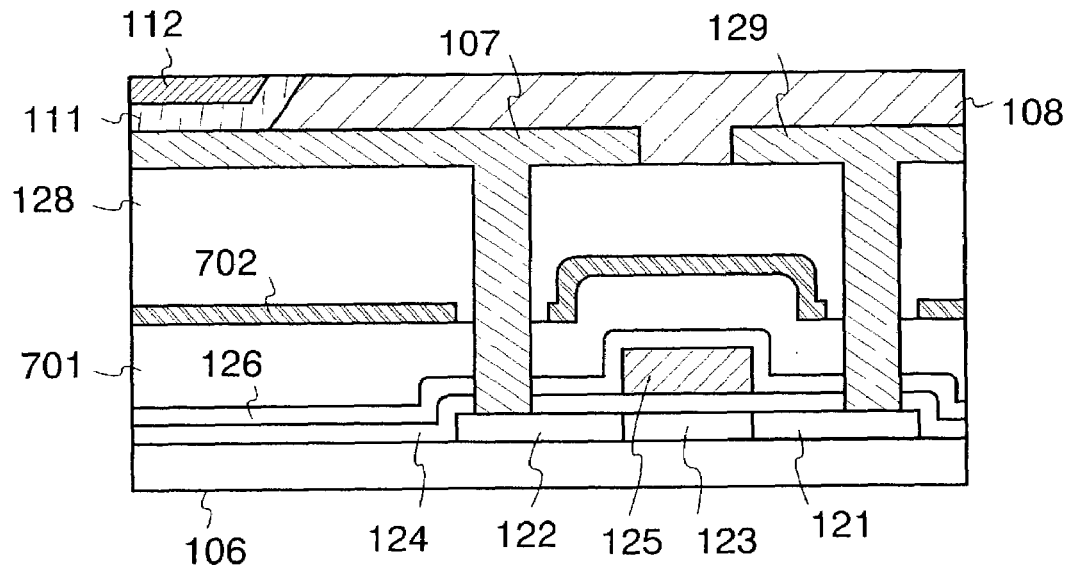
FIGS. 7A and 7B are cross sectional views illustrating the configuration of the display apparatus.
Figure 7B:
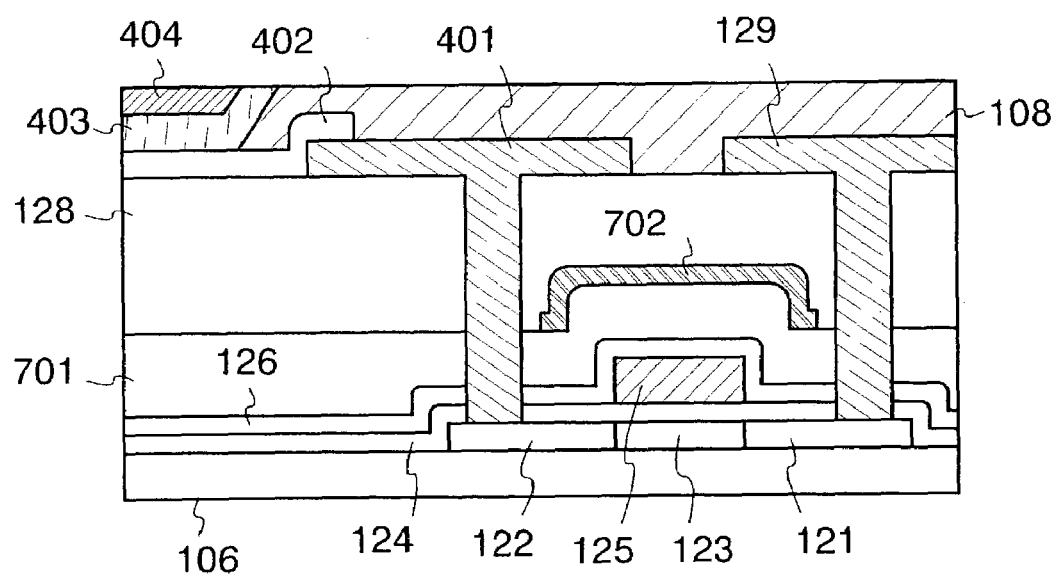

In this embodiment, an example in which a conductive film having radiation-absorbing ability is used as a part or the whole of a lightproof film is shown in FIGS. 7A and 7B. Principally, the configuration of the entire display apparatus and the configuration of the light-emitting device are similar to those of Embodiment 5 or Embodiment 8, so that it will be described with reference to an enlarged view corresponding to FIG. 1C or FIG. 4C.

In FIG. 7A, the description of structural components provided with the same reference numerals as those of FIG. 1C may be referred to those of Embodiment 5. The characteristic feature of the present embodiment is that an inorganic insulating film 701 is formed on a silicon compound film 126 and a conductive film having radiation-absorbing ability is provided as a light proof film 702 on the inorganic insulating film 701. Furthermore, the present embodiment is configured such that an organic resin film 128 is provided as a flattening film on the lightproof film 702.

Here, it is possible to use a conductive film containing an element having radiation-absorbing ability as a lightproof film 702. It is also possible to use a conductive film having radiation-absorbing ability or a layered film of the conductive film having radiation-absorbing ability and the conductive film containing an element having radiation-absorbing ability. In this case, the electric potential of the lightproof film 702 may be preferably fixed at a predetermined level. That is, an effect of decreasing variations of the threshold voltage (Vth) of a driving TFT 106 can be obtained when the electric potential of the lightproof film 702 is being fixed.

Furthermore, in the case of FIG. 7A, light emitted from a luminous body 111 travels toward a counter electrode 112. Therefore, in particular, there is no trouble such as a decrease in numerical aperture (effective display area) as the lightproof film 702 is provided. In addition, a heat-releasing effect can be expected with the presence of such a lightproof film 702. Therefore, the generation of heat equally by the action of a driving TFT can be expected. Furthermore, an effect of shielding the light leaked from a gap between a source wiring 129 and a pixel electrode 107 can be obtained.

In FIG. 7B, the description of structural components provided with the same reference numerals as those of FIG. 1C or FIG. 4C may be referred to those of Embodiment 5 or Embodiment 8. In this case, likewise, the characteristic feature of the present embodiment is that an inorganic insulating film 701 is formed on a silicon compound film 126 and a conductive film having radiation-absorbing ability is provided as a lightproof film 702 on the inorganic insulating film 701. In this case, likewise, it is possible to use a conductive film containing an element having radiation-absorbing ability as a lightproof film 702. It is also possible to use a conductive film having radiation-absorbing ability or a layered film of the conductive film having radiation-absorbing ability and the conductive film containing an element having radiation-absorbing ability. In addition, an effect of decreasing variations of the threshold voltage (Vth) of a driving TFT 106 can be obtained when the electric potential of the lightproof film 702 is being fixed.

In the case of FIG. 7B, however, light emitted from a luminous body 403 travels toward a pixel electrode 402, so that there is a need of removing a lightproof film 702 in the light-emitting region in advance. In this case, likewise, an effect of shielding the light leaked from a gap between a source wiring 129 and a pixel electrode 401 can be obtained.

A display apparatus having the configuration of the pixel part of the present embodiment has the following advantages. That is, even though an electron-beam deposition method is used in the formation of a counter electrode 112 or 404 to be provided as a cathode, radiation such as gamma ray, electron ray, or X ray can be shielded by a lightproof film 702. Therefore, the radiation cannot directly reach to a channel-forming region and a gate insulating film adjacent to the channel-forming region, so that it becomes possible to avoid a malfunction to be caused by the so-called radiation errors such as the generation of positive charges or an increase in interface state density.

As described above, according to the configuration of the pixel part shown in the present embodiment, it becomes possible to allow the film formation without any influence of radiation and to prevent the generation of trouble such as abnormal threshold voltage or abnormal value S with radiation when the metal film is formed using an electron-beam deposition method.

In the present embodiment, furthermore, the radiation-shielding effect can be further increased by providing the insulating film having radiation-absorbing ability shown in Embodiment 5 or Embodiment 8 as a part of the interlayer insulating film and combining such a film with the configuration of the present embodiment.

Embodiment 12

Figure 8:
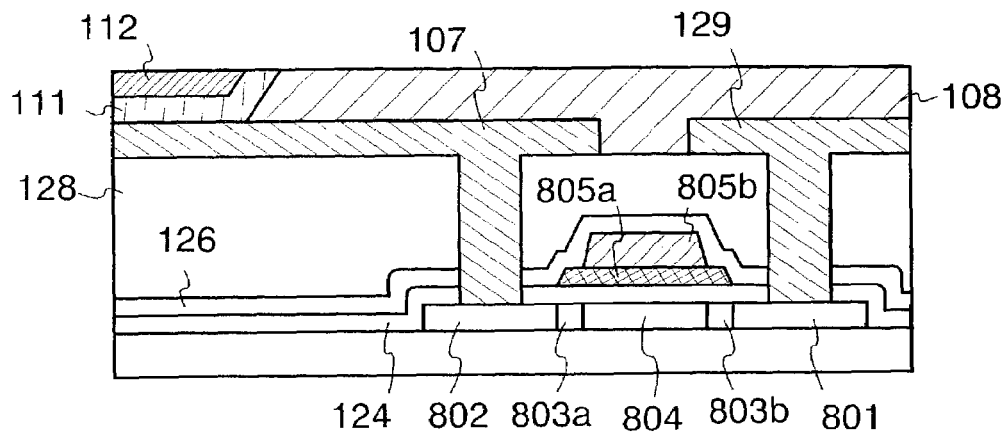
FIG. 8 is a cross sectional view illustrating the configuration of the display apparatus.

In this embodiment, an example in which a conductive film having radiation-absorbing ability is used as a part or the whole of a gate electrode (or gate wiring) of a transistor is shown in FIG. 8. Principally, the configuration of the entire display apparatus and the configuration of the light-emitting device are similar to those of Embodiment 5, so that it will be described with reference to an enlarged view corresponding to FIG. 1C.

In this embodiment, the configuration of an active layer comprises a source region 801, a drain region 802, light dope drain (LDD) regions 803a and 803b, and a channel-forming region 804. Furthermore, a gate electrode 805 is formed on a gate insulating film 124. The gate electrode 805 is constructed of a first conductive film 805a and a second conductive film 805b. Here, the first conductive film 805a is a conductive film having radiation-absorbing ability. On the other hand, the second conductive film 805b is a metal film such as an aluminum film, a tungsten film or a tantalum film. Furthermore, it is preferable to use a conductive film containing an element having radiation-absorbing ability as a second conductive film 805b because a more increase in the radiation-shielding effect can be attained.

In this embodiment, furthermore, a two-layered structure of the first conductive film 805a and the second conductive film 805b is exemplified in the description. Alternatively, it may be a gate electrode having a three-layered structure or more. In addition, the present invention is not limited to such a structure or configuration of the present embodiment. However, as shown in the present embodiment, a part of the gate electrode 805 is overlapped on the LDD regions 803a and 803b via a gate-insulating film 124 to inhibit a degradation to be caused by hot carrier injection. Furthermore, as the width of the first conductive film having radiation-absorbing ability is longer than the channel length of a channel-forming region, so that the channel-forming region can be more effectively protected from radiation.

A display apparatus having the configuration of the pixel part of the present embodiment has the following advantages. That is, even though an electron-beam deposition method is used in the formation of a counter electrode 112 or 404 to be provided as a cathode, radiation such as gamma ray, electron ray, or X ray can be shielded by a gate electrode 805. Therefore, the radiation cannot directly reach to a channel-forming region and a gate insulating film adjacent to the channel-forming region, so that it becomes possible to avoid a malfunction to be caused by the so-called radiation errors such as the generation of positive charges or an increase in interface state density.

As described above, according to the configuration of the pixel part shown in the present embodiment, it becomes possible to allow the film formation without any influence of radiation and to prevent the generation of trouble such as abnormal threshold voltage or abnormal value S with radiation when the metal film is formed using an electron-beam deposition method.

Furthermore, a radiation-shielding effect can be further increased by making a combination between the combination of the present embodiment and insulating film having radiation-absorbing ability shown in Embodiment 5 as a part of interlayer-insulating film, the conductive film having radiation-absorbing ability shown in Embodiment 6 as a part or the whole of the source wiring or the like, or a conductive film containing an element having radiation-absorbing ability shown in Embodiment 7. Of course, it is also possible to adopt the configuration of a pixel electrode shown in Embodiments 8 to 10.

Embodiment 13

Figures 9A, 9B:
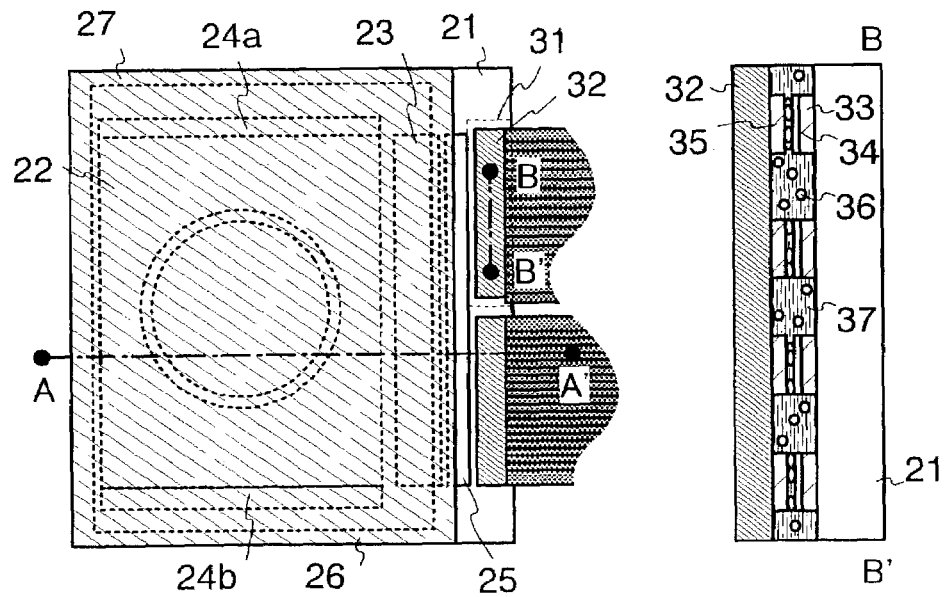
FIGS. 9A to 9C are diagrams showing the appearance of the display apparatus, where
Figure 9C:
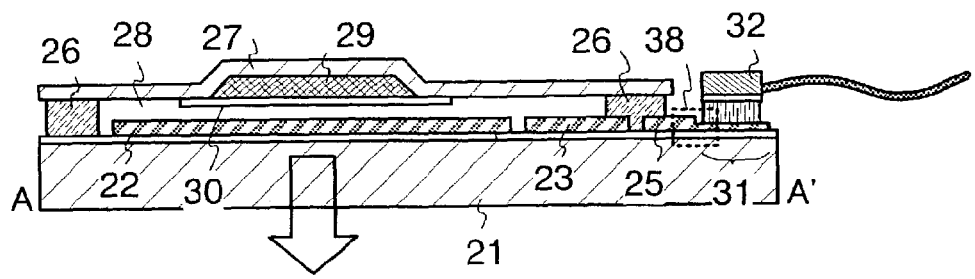

In the present embodiment, the configuration of the entire electroluminescence display apparatus on which the present invention can be applied will be described with reference to FIGS. 9A to 9C. FIG. 9A is a top view of an electroluminescence display apparatus prepared by sealing a device substrate on which a thin film transistor is formed with a sealing material. FIG. 9B is a cross sectional view along the line of B-B' in FIG. 9A and FIG. 9C is a cross sectional view along the ling A-A' of FIG. 9A.

A pixel part (display part) 22 is mounted on a substrate 21. In addition, a data line drive circuit 23, gate line drive circuits 24a and 24b, and a protective circuit 25 are arranged on the substrate 21 such that they surround the pixel part 22. Furthermore, a sealing material 26 is provided such that it surrounds these structural components. The configuration of the pixel part 22 may be one of those described in Embodiments 8 to 12. The sealing material 26 may be an ultraviolet curing resin, an epoxy resin, or the like. Preferably, the sealing material may be a material with lowest possible hygroscopic property. By the way, the sealing material 26 may be formed such that it is piled up on part of the data line drive circuit 23, gate line drive circuits 24a and 24b, and a protective circuit 25, or may be provided such that it makes a detour to avoid these circuits.

Furthermore, a sealing substrate 27 is adhered on the substrate 21 through these components to form a sealed space 28 with the sealing material 26 and the sealing substrate 27. The sealing substrate 27 may be a glass material, a metal material (typically, a stain steel material), a ceramic material, or a plastic material (including a plastic film).

Furthermore, when a material which is different from the substrate 21 is used as a sealing substrate 27, there is a possibility of impairing the adhesion properties of the sealing material 26 as a result of the difference between their thermal expansion coefficients. Therefore, the sealing substrate 27 may be preferably the same material as that of the substrate 21 on which the transistor is formed. In other words, it is preferable to use a material having the same thermal expansion coefficient as that of the substrate 21. In this embodiment, glass is used as a material of the substrate 21 and the sealing substrate 27. In addition, the sealing substrate 27 may be subjected to the same heat history as that of the substrate 21 in the step of preparing a thin film transistor, so that their thermal expansion coefficients will be in close agreement with each other.

The sealing substrate 27 has a concave portion in which a moisture absorbent (e.g., barium oxide or calcium oxide) 29 is placed in advance to keep the closed space 28 under clear atmosphere by adsorbing water, oxygen, or the like. Thus, the sealing substrate 27 plays a role in the inhibition of deterioration of an EL layer. The concave portion is covered with a small-meshed cover material 30. In addition, air and water can pass through but the moisture absorbent 29 cannot. Furthermore, the closed space 28 may be filled with rare gas such as nitrogen or argon, or alternatively a resin or a liquid may be filled as far as it is inactive.

Furthermore, on the substrate 21, a terminal part 31 for transmitting signals to the data line drive circuit 23 and the gate line drive circuits 24a, 24b is formed. In addition, data signals such as video signals are transmitted to the terminal area 31 through a flexible print circuit (FPC) 32. The cross sectional view of the terminal area 31 is shown in FIG. 9B, in which wiring having a structure in which an oxide conductive film 34 is piled up on wiring 33 simultaneously formed with gate wiring or data wiring and wiring 35 formed toward the FPC 32 are electrically connected to each other using a resin 37 in which particles of a conductive material 36 are dispersed. Here, the conductive material may be a globular polymer compound coated with gold or silver plating.

In the present embodiment, the protective circuit 25 is placed between the terminal area 31 and the date drive circuit 23 and is responsible for releasing a pulse signal outside when the static electricity is caused by sudden pulse signals between them. Simultaneously, at first, a capacitor weakens a high voltage signal momentarily introduced, and other high voltage signals may be allowed to escape to the out side by a circuit constructed of a thin film transistor or a thin film diode. Alternatively, the protective circuit may be formed on other place, such as one between the pixel part 22 and the gate line drive circuited 24a, 24b.

Furthermore, the electroluminescence display apparatus may use one of pixel structures of embodiments 5 to 7. In this case, the oxide conductive film 34 cannot be arranged on the terminal areas 31. However, there is no problem in action.

Embodiment 14

The structures of the thin film transistor described in Embodiments 1 to 11 all become top-gate structures (specifically, planar structures). In each embodiment, however, a bottom-gate structure (typically, reverse stagger structure) can be adopted as well. In that case, only the positions of the semiconductor layer of the active layer etc. and the first metal layer of the gate electrode etc. become reversed. Moreover, the application thereof is not limited to the thin film transistor but may be made of a MOS structure transistor formed by using silicon well.

Embodiment 15

The display devices shown in Embodiments 1 to 13 each exemplify an electroluminescence display device. However, the present invention can be applied to all of the semiconductor processes that use an electronic beam evaporation method, such as a liquid crystal display device that uses an electronic beam evaporation method, a field emission display device and other display devices.

Embodiment 16

Examples of electronic apparatuses employing a display device of the present invention to a display portion therein can be given as a video camera, a digital camera, a goggle type display (head mounted display), a navigation system, an audio reproducing apparatus (car audio, an audio component, and the like), a laptop computer, a game machine, a portable information terminal (a mobile computer, a cellular phone, a portable game machine, an electronic book, etc.), and an image reproducing apparatus including a recording medium (specifically, an apparatus capable of processing data in a recording medium such as a Digital Versatile Disk (DVD) and having a display that can display the image of the data). Practical examples thereof are shown in FIGS. 10A to 10H.

Figure 10A:
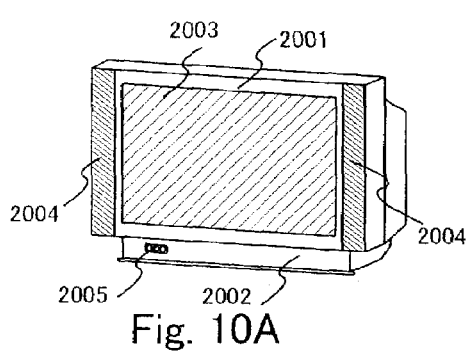
FIGS. 10A to 10H are diagrams showing examples of electrical equipments.

FIG. 10A shows a television, which comprises a casing 2001, a supporting base 2002, a display portion 2003, speaker units 2004, a video input terminal 2005, etc. The present invention is applied to the display portion 2003. The term television includes every television for displaying information such as one for a personal computer, one for receiving TV broadcasting, and one for advertisement.

Figure 10B:
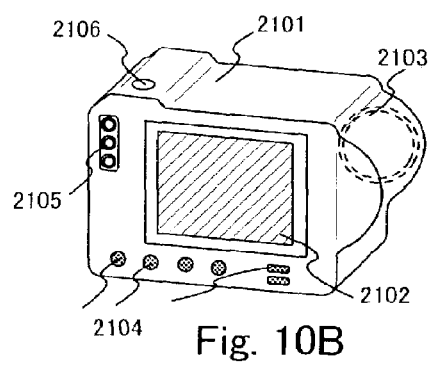

FIG. 10B shows a digital camera, which comprises a main body 2101, a display portion 2102, an image receiving unit 2103, operation keys 2104, an external connection port 2105, a shutter 2106, etc. The present invention is applied to the display portion 2102.

Figure 10C:
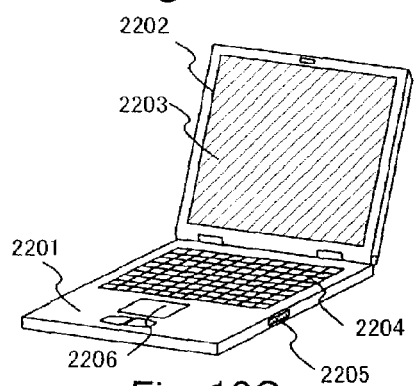

FIG. 10C shows a laptop computer, which comprises a main body 2201, a casing 2202, a display portion 2203, a keyboard 2204, an external connection port 2205, a pointing mouse 2206, etc. The present invention is applied to the display portion 2203.

Figure 10D:
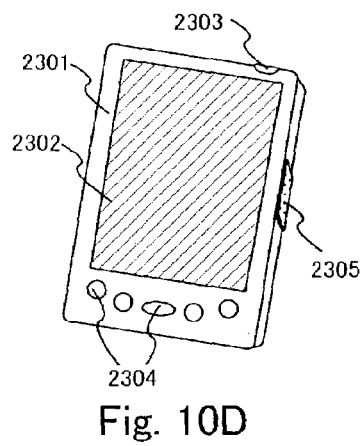

FIG. 10D shows a mobile computer, which comprises a main body 2301, a display portion 2302, a switch 2303, operation keys 2304, an infrared ray port 2305, etc. The present invention is applied to the display portion 2302.

Figure 10E:
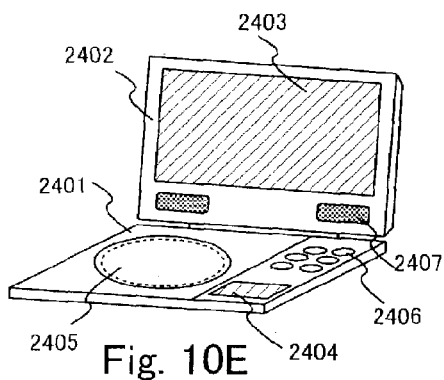

FIG. 10E shows a portable image reproducing apparatus equipped with a recording medium (a DVD player, to be specific). The apparatus comprises a main body 2401, a casing 2402, a display portion A 2403, a display portion B 2404, a recording medium (such as DVD) reading unit 2405, operation keys 2406, speaker units 2407, etc. The display portion A 2403 mainly displays image information whereas the display portion B 2404 mainly displays text information. The present invention is applied to the display portions A 2403 and B 2404. The term image reproducing apparatus equipped with a recording medium includes domestic game machines.

Figure 10F:
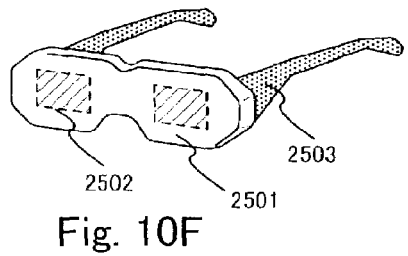

FIG. 10F shows a goggle type display (head mounted display), which comprises a main body 2501, display portions 2502, and arm units 2503. The present invention is applied to the display portion 2502.

Figure 10G:
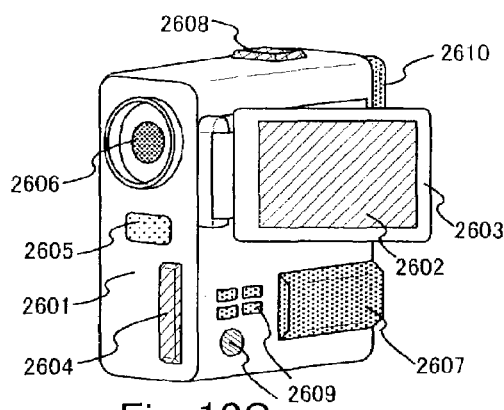

FIG. 10G shows a video camera, which comprises a main body 2601, a display portion 2602, a casing 2603, an external connection port 2604, a remote control receiving unit 2605, an image receiving unit 2606, a battery 2607, an audio input unit 2608, operation keys 2609 etc. The present invention is applied to the display portion 2602.

Figure 10H:
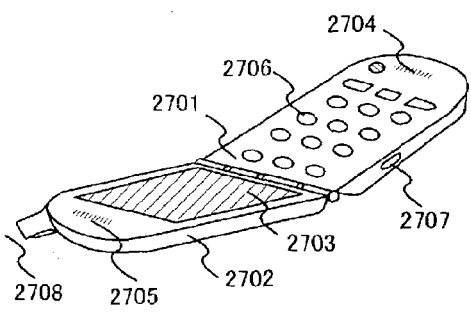
Figure 11:
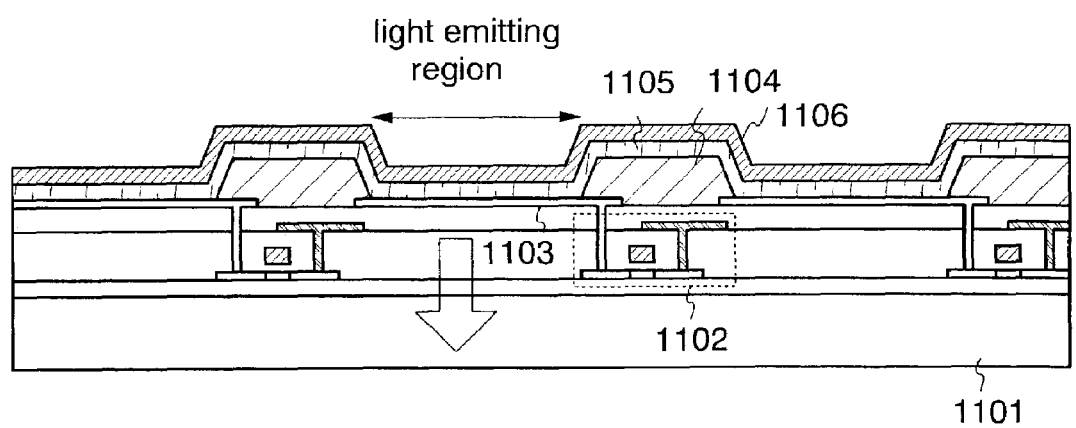
FIG. 11 is a cross sectional view illustrating a pixel configuration of the conventional display apparatus.
Figure 12A:
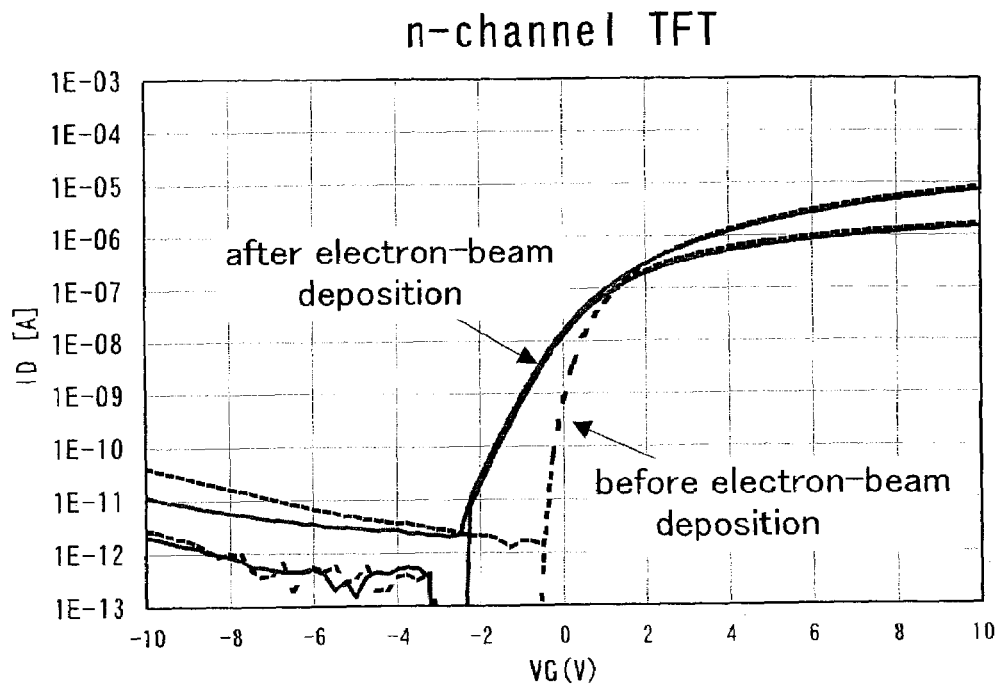
FIGS. 12A and 12B are graphs representing the $I_d$-$V_g$ characteristics of a this film transistors.
Figure 12B:
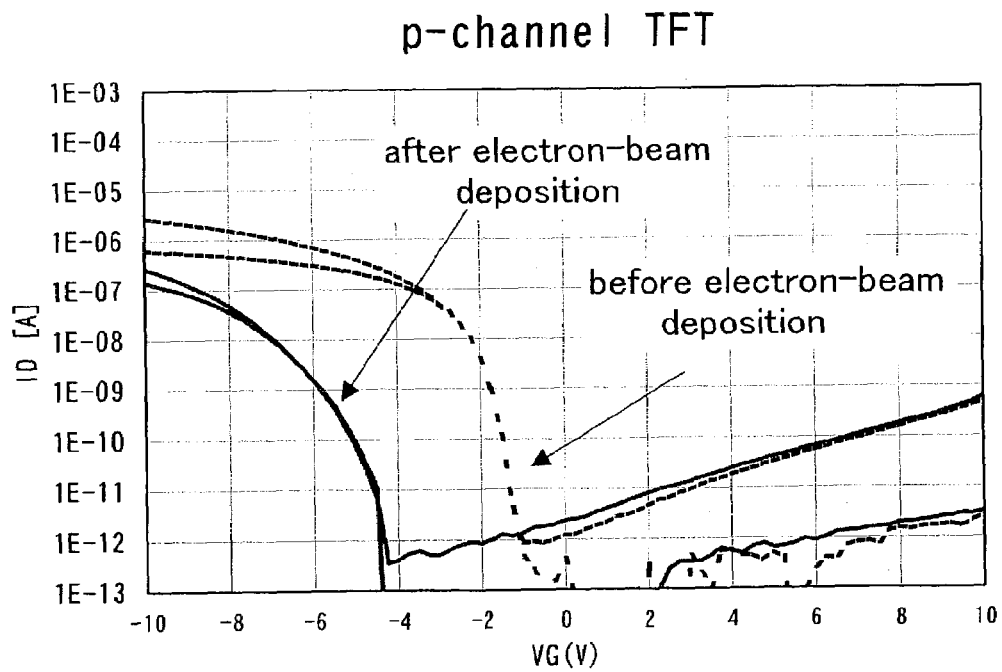

FIG. 10H shows a cellular phone, which comprises a main body 2701, a casing 2702, a display portion 2703, an audio input unit 2704, an audio output unit 2705, operation keys 2706, an external connection port 2707, an antenna 2708, etc. The present invention is applied to the display portion 2703. If the display portion 2703 displays white characters on a black background, power consumption of the cellular phone can be reduced.

As described above, the display device obtained by implementing the present invention may be used as the display portions of any electronic apparatus. The electronic apparatuses of the present Embodiment may use any structure of the display device shown in Embodiments 1 to 15.

Accordingly, the present invention solves a problem in which radiation such as gamma ray, neutron, or X ray is irradiated on a transistor formed on a substrate to be processed. Therefore, the transistor can be prevented from becoming malfunction accompanied by the generation of positive electrons generated in an oxide film by the radiation, the generation of interface state density in the Si—SiO$_2$ interface, or the generation of neutral electron trap in the oxide film. Furthermore, a display apparatus having a high reliability can be obtained by preventing the generation of abnormal threshold voltage or abnormal value S.

What is claimed is:

1. A display apparatus comprising:
    a transistor over a substrate; and
    a light-emitting device electrically connected to the transistor,
    wherein the transistor comprises a conductive film having iron, and an electric potential of the conductive film is fixed,
    wherein the conductive film is comprised in a gate wiring of the transistor, and
    wherein a width of the conductive film is longer than a channel length of a channel forming region of the transistor.

2. A display apparatus according to claim 1, wherein the conductive film is located over a channel forming region of the transistor.

3. A display apparatus according to claim 1, wherein the conductive film is formed in a grid pattern.

4. A display apparatus according to claim 1, wherein the light-emitting device is an electroluminescent element.

5. An electronic equipment comprising a display apparatus according to claim 1.

6. A display apparatus comprising:
    a transistor over a substrate; and
    a light-emitting device electrically connected to the transistor,
    wherein the transistor comprises a conductive film having iron, and an electric potential of the conductive film is fixed,
    wherein the conductive film is comprised in at least one of a source wiring and a drain wiring of the transistor, and
    wherein the conductive film overlaps with a channel forming region of the transistor.

7. A display apparatus according to claim 6, wherein the conductive film is located over a channel forming region of the transistor.

8. A display apparatus according to claim 6, wherein the conductive film is formed in a grid pattern.

9. A display apparatus according to claim 6, wherein the light-emitting device is an electroluminescent element.

10. An electronic equipment comprising a display apparatus according to claim 6.

11. A display apparatus comprising:
    a transistor over a substrate; and
    a light-emitting device electrically connected to the transistor,
    wherein a gate wiring of the transistor comprises a lower conductive film and an upper conductive film on the lower conductive film, and
    wherein the lower conductive film comprises lead, and an electric potential of the conductive film is fixed.

12. A display apparatus according to claim 11, wherein the conductive film is formed in a grid pattern.

13. A display apparatus according to claim 11, wherein the light-emitting device is an electroluminescent element.

14. An electronic equipment comprising a display apparatus according to claim 11.

15. A display apparatus comprising:
    a transistor over a substrate; and
    a light-emitting device electrically connected to the transistor,
    wherein the transistor comprises a conductive film comprising lead over a channel-forming region of the transistor, and an electric potential of the conductive film is fixed, and
    wherein the conductive film is comprised in at least one of a source wiring and a drain wiring of the transistor.

16. A display apparatus according to claim 15, wherein the conductive film is formed in a grid pattern.

17. A display apparatus according to claim 15, wherein the light-emitting device is an electroluminescent element.

18. An electronic equipment comprising a display apparatus according to claim 15.

19. A display apparatus comprising:
    a transistor over a substrate;
    a light-emitting device electrically connected to the transistor, and
    wherein a gate wiring of the transistor comprises a lower conductive film and an upper conductive film on the lower conductive film, and
    wherein the lower conductive film comprises lead.

20. A display apparatus according to claim 19, wherein the conductive film is located over a channel forming region of the transistor.

21. A display apparatus according to claim 19, wherein the conductive film is formed in a grid pattern.

22. A display apparatus according to claim 19, wherein the light-emitting device is an electroluminescent element.

23. An electronic equipment comprising a display apparatus according to claim 19.

24. A display apparatus comprising:
    a transistor over a substrate;
    a conductive film comprising lead over the transistor; and
    a light-emitting device electrically connected to the transistor, and
    wherein the conductive film is comprised in at least one of a source wiring and a drain wiring of the transistor.

25. A display apparatus according to claim 24, wherein the conductive film is located over a channel forming region of the transistor.

26. A display apparatus according to claim 24, wherein the conductive film is formed in a grid pattern.

27. A display apparatus according to claim 24, wherein the light-emitting device is an electroluminescent element.

28. An electronic equipment comprising a display apparatus according to claim 24.

29. A display apparatus comprising:
a transistor over a substrate; and
a light-emitting device electrically connected to the transistor, the transistor comprising:
a semiconductor film;
a nitrogen-containing silicon compound film over the semiconductor film; and
an insulating film comprising lead as a part of an interlayer-insulating film on the nitrogen-containing silicon compound film.

30. A display apparatus according to claim 29, wherein the insulating film is located over a channel forming region of the transistor.

31. A display apparatus according to claim 29, wherein an organic resin film is formed above the insulating film.

32. A display apparatus according to claim 29, wherein the light-emitting device is an electroluminescent element.

33. An electronic equipment comprising a display apparatus according to claim 29.

34. A display apparatus according to claim 29, wherein the insulating film is covered by nitrogen-containing silicon compound films.

35. A display apparatus according to claim 29, wherein the insulating film comprises an organic resin film containing dispersed fine particles of lead.

36. A display apparatus according to claim 29 further comprising a plurality of silicon compound films over the transistor, wherein the insulating film is sandwiched between silicon compound films.

37. A display apparatus comprising:
a transistor over a substrate;
a light-emitting device electrically connected to the transistor, and
a plurality of silicon compound films over the transistor,
wherein the transistor comprises an insulating film comprising iron as a part of an interlayer-insulating film, and
wherein the insulating film is sandwiched between silicon compound films.

38. A display apparatus according to claim 37, wherein the insulating film is located over a channel forming region of the transistor.

39. A display apparatus according to claim 37, wherein an organic resin film is formed above the insulating film.

40. A display apparatus according to claim 37, wherein the light-emitting device is an electroluminescent element.

41. An electronic equipment comprising a display apparatus according to claim 37.

42. A display apparatus according to claim 37, wherein the silicon compound films comprise nitrogen-containing silicon.

* * * * *